(12) United States Patent
Choi et al.

(10) Patent No.: US 12,439,777 B2
(45) Date of Patent: Oct. 7, 2025

(54) DISPLAY APPARATUS AND METHOD OF MANUFACTURING THE SAME

(71) Applicant: Samsung Display Co., Ltd., Yongin-si (KR)

(72) Inventors: Nakcho Choi, Yongin-si (KR); Chungi You, Yongin-si (KR); Jaehun Lee, Yongin-si (KR); Jihee Kim, Yongin-si (KR); Yangho Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 141 days.

(21) Appl. No.: 16/991,410

(22) Filed: Aug. 12, 2020

(65) Prior Publication Data

US 2021/0217839 A1   Jul. 15, 2021

(30) Foreign Application Priority Data

Jan. 10, 2020   (KR) .................. 10-2020-0003878

(51) Int. Cl.
*H01L 27/32*      (2006.01)
*H01L 23/29*      (2006.01)
*H10K 59/122*     (2023.01)
*H10K 59/123*     (2023.01)
*H10K 59/131*     (2023.01)
(Continued)

(52) U.S. Cl.
CPC ......... *H10K 59/123* (2023.02); *H10K 59/122* (2023.02); *H10K 59/131* (2023.02); *H10K 59/8792* (2023.02); *H10K 71/00* (2023.02); *H10K 59/1201* (2023.02)

(58) Field of Classification Search
CPC .......... H01L 27/3246; H01L 2251/558; H01L 23/29; H01L 27/1248; H01L 27/3258; H01L 27/3282; H01L 27/3295; H10K 59/123; H10K 59/122
See application file for complete search history.

(56) References Cited

U.S. PATENT DOCUMENTS 9,196,667 B2    11/2015   Im et al.
9,632,375 B2 *   4/2017   Chen ................... G02F 1/13452
(Continued)

FOREIGN PATENT DOCUMENTS

CN        107221602 A    9/2017
CN        109616497 A    4/2019
(Continued)

*Primary Examiner* — Chad M Dicke
*Assistant Examiner* — Valerie N Newton
(74) *Attorney, Agent, or Firm* — Womble Bond Dickinson (US) LLP

(57) ABSTRACT

A display apparatus having improved reliability includes: a substrate; a thin film transistor on the substrate; a pixel electrode electrically connected to the thin film transistor; a first transparent planarization layer between the thin film transistor and the pixel electrode, the first transparent planarization layer including a first contact hole for electrically connecting the thin film transistor to the pixel electrode and including a transparent material; and a colored planarization layer on the first transparent planarization layer, the colored planarization layer including a second contact hole for electrically connecting the thin film transistor to the pixel electrode and including a colored pigment or carbon black.

16 Claims, 17 Drawing Sheets

(51) Int. Cl.
*H10K 59/80* (2023.01)
*H10K 71/00* (2023.01)
*H10K 59/12* (2023.01)

(56) References Cited

U.S. PATENT DOCUMENTS

| | | | |
|---|---|---|---|
| 10,002,918 | B2 | 6/2018 | Park et al. |
| 10,199,608 | B2 | 2/2019 | Woo et al. |
| 10,497,759 | B2 | 12/2019 | Song et al. |
| 10,522,605 | B2 | 12/2019 | Cho et al. |
| 10,566,578 | B2 | 2/2020 | Sakamoto et al. |
| 10,854,695 | B2 | 12/2020 | Tang et al. |
| 10,859,813 | B2 * | 12/2020 | Hadwen ............... H01L 27/1248 |
| 2010/0165255 | A1 | 7/2010 | Ishitani et al. |
| 2016/0036005 | A1 * | 2/2016 | Qi ....................... H10K 59/122 257/40 |
| 2016/0233236 | A1 * | 8/2016 | Lai .................... H01L 29/78633 |
| 2018/0267374 | A1 * | 9/2018 | Long ................. H01L 29/78618 |
| 2019/0033640 | A1 * | 1/2019 | He ...................... H01L 27/1288 |
| 2019/0056606 | A1 | 2/2019 | Jung et al. |
| 2019/0096975 | A1 * | 3/2019 | Park ...................... H10K 59/131 |
| 2019/0172887 | A1 * | 6/2019 | Sun ..................... G06V 40/1318 |
| 2019/0198819 | A1 * | 6/2019 | Shin ........................ H10K 59/38 |
| 2019/0245017 | A1 | 8/2019 | Jeon et al. |
| 2020/0012089 | A1 | 1/2020 | Hadwen et al. |
| 2020/0235177 | A1 * | 7/2020 | Tang .................... H01L 51/5284 |
| 2020/0312925 | A1 * | 10/2020 | Xia ...................... H01L 27/3258 |
| 2022/0165829 | A1 * | 5/2022 | Yuan .................. H01L 27/1255 |

FOREIGN PATENT DOCUMENTS

| | | |
|---|---|---|
| KR | 10-2014-0071806 A | 6/2014 |
| KR | 10-2016-0081311 A | 7/2016 |
| KR | 10-2016-0082865 A | 7/2016 |
| KR | 10-1719350 B1 | 3/2017 |
| KR | 10-2017-0096644 A | 8/2017 |
| KR | 10-2020-0006647 A | 1/2020 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2020-0003878, filed on Jan. 10, 2020 in the Korean Intellectual Property Office, the entire disclosure of which is incorporated herein by reference.

BACKGROUND

1. Field

Aspects of embodiments of the present disclosure relate to a display apparatus and a method of manufacturing a display apparatus.

2. Description of Related Art

As a display apparatus for displaying images, an organic light-emitting diode display apparatus has a self-emitting characteristic, unlike a liquid crystal display apparatus. Therefore, an additional light source is not necessary, and, thus, a thickness and a weight of a display apparatus may be reduced. Also, an organic light-emitting diode display apparatus exhibits excellent characteristics, such as low power consumption, high luminance, and rapid response speed.

SUMMARY

An organic light-emitting diode display apparatus has to have an excellent contrast and a high luminance, but the contrast may degrade when external light is intense. To prevent or reduce this, a pixel defining layer having a certain color (e.g., black) may be provided, but dark spots may generate due to residues of a process of forming a colored pixel defining layer. One or more embodiments include a display apparatus having improved reliability, in which degradation in characteristics due to external light may be prevented or reduced and defects caused by dark spots may be prevented or reduced, and a method of manufacturing the display apparatus. However, the above aspects and technical features are provided as examples, and the scope of the present disclosure is not limited thereto.

Additional aspects will be set forth, in part, in the description which follows and, in part, will be apparent from the description, or may be learned by practice of the presented embodiments of the disclosure.

According to one or more embodiments, a display apparatus includes: a substrate; a thin film transistor on the substrate; a pixel electrode electrically connected to the thin film transistor; a first transparent planarization layer between the thin film transistor and the pixel electrode, the first transparent planarization layer including a first contact hole for electrically connecting the thin film transistor to the pixel electrode and including a transparent material; and a colored planarization layer on the first transparent planarization layer, the colored planarization layer including a second contact hole for electrically connecting the thin film transistor to the pixel electrode and including a colored pigment or carbon black.

The colored planarization layer may be directly on the first transparent planarization layer, the first transparent planarization layer may include a positive photosensitive material, and the colored planarization layer may include a negative photosensitive material.

The thin film transistor may include a semiconductor layer, a gate electrode, and a connecting electrode, the gate electrode being on the semiconductor layer and the connecting electrode being on the gate electrode, and the semiconductor layer and the gate electrode may be insulated from each other by a first insulating layer, and the gate electrode and the connecting electrode may be insulated from each other by a second insulating layer and a third insulating layer.

The first transparent planarization layer may have a first thickness from an upper surface of the third insulating layer, and the first thickness may be about 0.5 µm to about 2 µm.

The colored planarization layer may have a second thickness from an upper surface of the first transparent planarization layer, and the second thickness may be about 0.5 µm to about 2 µm.

The first contact hole in the first transparent planarization layer and the second contact hole in the colored planarization layer may overlap with each other.

The first contact hole may have a first width, and the second contact hole may have a second width that is different from the first width.

The first width may be about 3 µm to about 5 µm.

The second width may be about 5 µm to about 7 µm.

The display apparatus may further include a pixel defining layer including a first opening that at least partially exposes the pixel electrode, an intermediate layer including an emission layer and at least one functional layer, the emission layer overlapping the first opening, and an opposite electrode on the intermediate layer.

The display apparatus may further include a spacer on the pixel defining layer, and the spacer may include a material that is the same as a material included in the pixel defining layer.

The display apparatus may further include a second transparent planarization layer between the substrate and the first transparent planarization layer.

The second transparent planarization layer may have a third thickness from an upper surface of the third insulating layer, and the third thickness may be about 0.5 µm to about 2 µm.

According to one or more embodiments, a method of manufacturing a display apparatus includes: forming a thin film transistor on a substrate; forming a first transparent planarization layer on the thin film transistor, the first transparent planarization layer including a first contact hole and including a transparent material; forming a colored planarization layer on the first transparent planarization layer, the colored planarization layer including a second contact hole and including a colored pigment or carbon black; and forming a pixel electrode on the colored planarization layer, the pixel electrode being electrically connected to the thin film transistor via the first contact hole and the second contact hole.

The forming of the colored planarization layer may include forming a colored material layer on the first transparent planarization layer, partially exposing the colored material layer, and forming the second contact hole by developing the colored material layer that is exposed.

The method may further include, after the forming of the second contact hole, curing the colored planarization layer.

The colored planarization layer may be directly on the first transparent planarization layer, the first transparent planarization layer may include a positive photosensitive material, and the colored planarization layer may include a negative photosensitive material.

The thin film transistor may include a semiconductor layer, a gate electrode, and a connecting electrode, the gate electrode being on the semiconductor layer and the connecting electrode being on the gate electrode, and the semiconductor layer and the gate electrode may be insulated from each other by a first insulating layer, and the gate electrode and the connecting electrode may be insulated from each other by a second insulating layer and a third insulating layer.

The first transparent planarization layer may have a first thickness from an upper surface of the third insulating layer, and the colored planarization layer may have a second thickness from an upper surface of the first transparent planarization layer.

The first contact hole in the first transparent planarization layer and the second contact hole in the colored planarization layer may overlap with each other, and the first contact hole may have a first width, and the second contact hole may have a second width that is different from the first width.

Other aspects, features and advantages of the disclosure will become better understood through the accompanying drawings, the claims, and the following detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
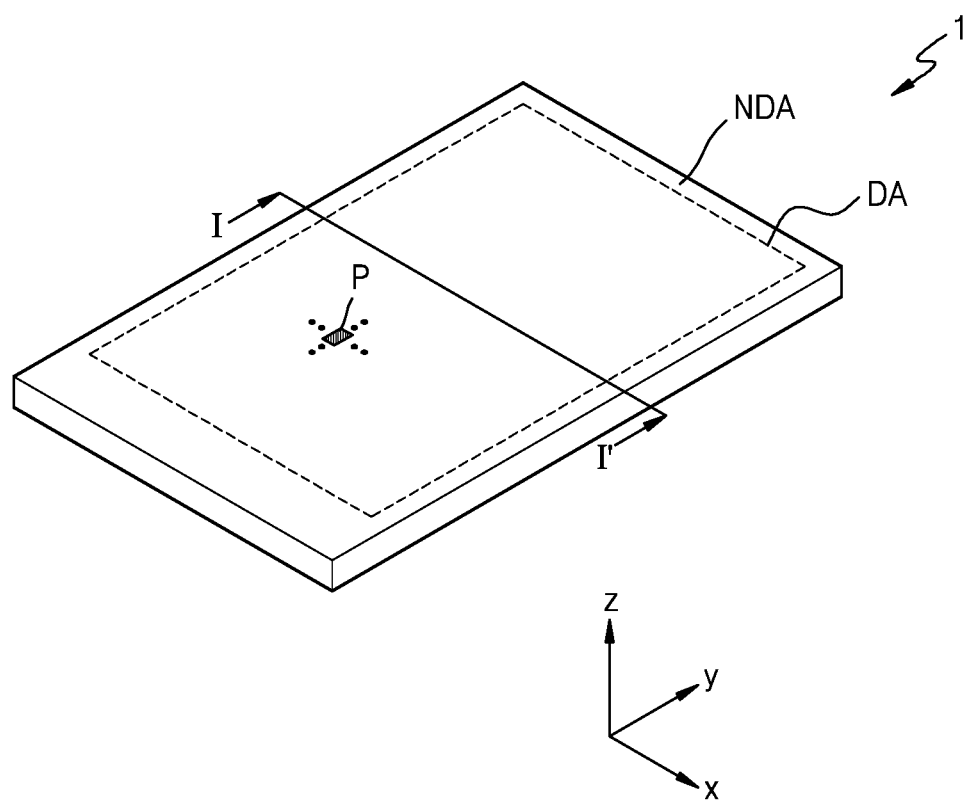
FIG. 1 and FIG. 2 are perspective views of a display apparatus according to an embodiment.

Reference will now be made in further detail to embodiments, some examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

While such terms as "first," "second," etc., may be used to describe various components, such components are not to be limited by the above terms. The above terms are used to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

In the specification, the phrase "A and/or B" denotes A, B, or A and B. In addition, the phrase "at least one of A and B" denotes A, B, or A and B.

In the specification herein, a line "extending in a first direction or a second direction" denotes extending in the first direction or the second direction in zig-zags or in a curve, as well as extending straightly in the first direction or the second direction.

Throughout the specification, the phrase "in a plan view" denotes viewing a target portion from the top, and the phrase "in a cross-sectional view" denotes viewing of a cross-section of the target portion that is vertically cut from a lateral direction. Throughout the specification, the expression "overlap" includes overlapping in a plan view and overlapping in a cross-sectional view.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Some example embodiments will be described below in further detail with reference to the accompanying drawings. Those components that are the same or are in correspondence are rendered the same reference numeral regardless of the figure number.

Figure 2:
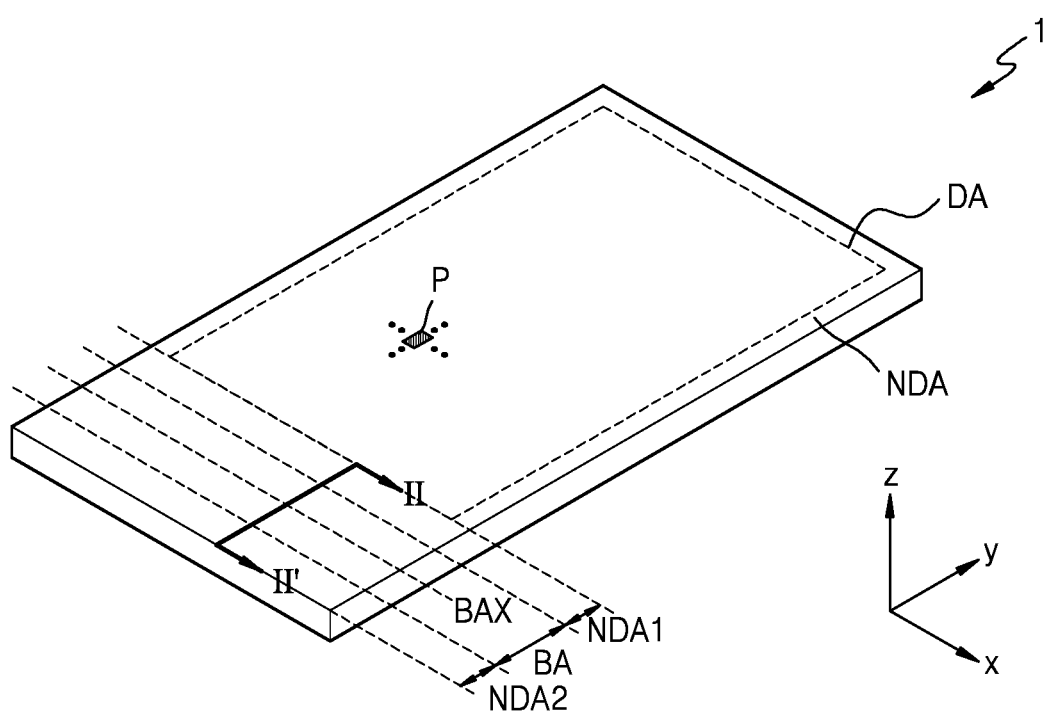

FIG. 1 and FIG. 2 are perspective views of a display apparatus 1 according to an embodiment.

Referring to FIG. 1, the display apparatus 1 may include a display area DA and a non-display area NDA at a periphery of the display area DA. In an embodiment, the non-display area NDA may surround the display area DA. The display apparatus 1 may provide images by using light emitted from a plurality of pixels P in the display area DA. The non-display area NDA may not display images.

Herein, according to an embodiment, although the display apparatus 1 is described as an organic light-emitting display apparatus, the disclosure is not limited thereto. For example, in another embodiment, the display apparatus 1 may include an inorganic light-emitting display (or an inorganic EL display apparatus), or a quantum dot light-emitting display apparatus. For example, a light-emitting layer of a display element included in the display apparatus 1 may include an organic material, an inorganic material, quantum dots, an organic material and quantum dots, or an inorganic material and quantum dots.

FIG. 1 shows the display apparatus 1 having a flat display surface, but one or more embodiments are not limited thereto. In an embodiment, the display apparatus 1 may include a three-dimensional display surface or a curved display surface.

When the display apparatus 1 includes the three-dimensional display surface, the display apparatus 1 includes a plurality of display areas directing differently from one another, e.g., a polyprism-type display surface. In another embodiment, when the display apparatus 1 includes a curved display surface, the display apparatus 1 may be implemented in various types, e.g., a flexible display apparatus, a foldable display apparatus, a rollable display apparatus, etc.

FIG. 1 shows the display apparatus 1 that may be applied to a mobile terminal. Although not shown in FIG. 1, a mobile terminal may be configured by arranging electronic modules, a camera module, a power module, etc. mounted on a main board in a bracket/case together with the display apparatus 1. The display apparatus 1 according to an embodiment may be applied to any of a large-sized electronic apparatus, such as a television, a monitor, etc., and a small- or medium-sized electronic apparatus, such as a tablet terminal, a car navigation system, a game console, a smart watch, etc.

In FIG. 1, the display area DA of the display apparatus 1 has a rectangular shape, but the display area DA may have a circular shape, an elliptical shape, or a polygonal shape, such as a triangular shape, a pentagonal shape, etc.

Referring to FIG. 2, in an embodiment, the non-display area NDA may further include a first non-display area NDA1, a second non-display area NDA2, and a bending area BA, in addition to the non-display area NDA around (e.g., surrounding) the display area DA. The bending area BA may be bent about a bending axis BAX extending in an x-direction as shown in FIG. 2.

The first non-display area NDA1 and the second non-display area NDA2 may be defined based on the bending area BA. The first non-display area NDA1 may be adjacent to the display area DA. The second non-display area NDA2 is not visible from the front portion when the bending area BA is bent and may include a data driving circuit 150 (see FIG. 5) that will be described later.

The first non-display area NDA1 may not display images in a final display apparatus or an electronic device such as a smartphone including the display apparatus, like the non-display area NDA.

Figure 3:
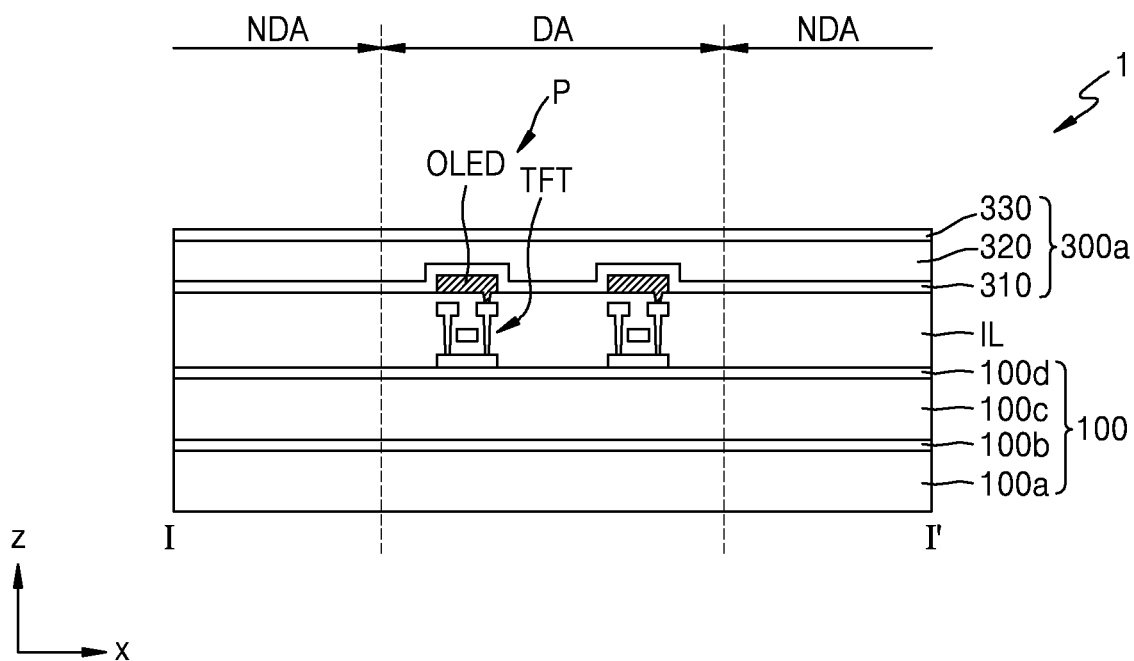
FIG. 3 and FIG. 4 are cross-sectional views of a display apparatus according to some embodiments.
Figure 4:
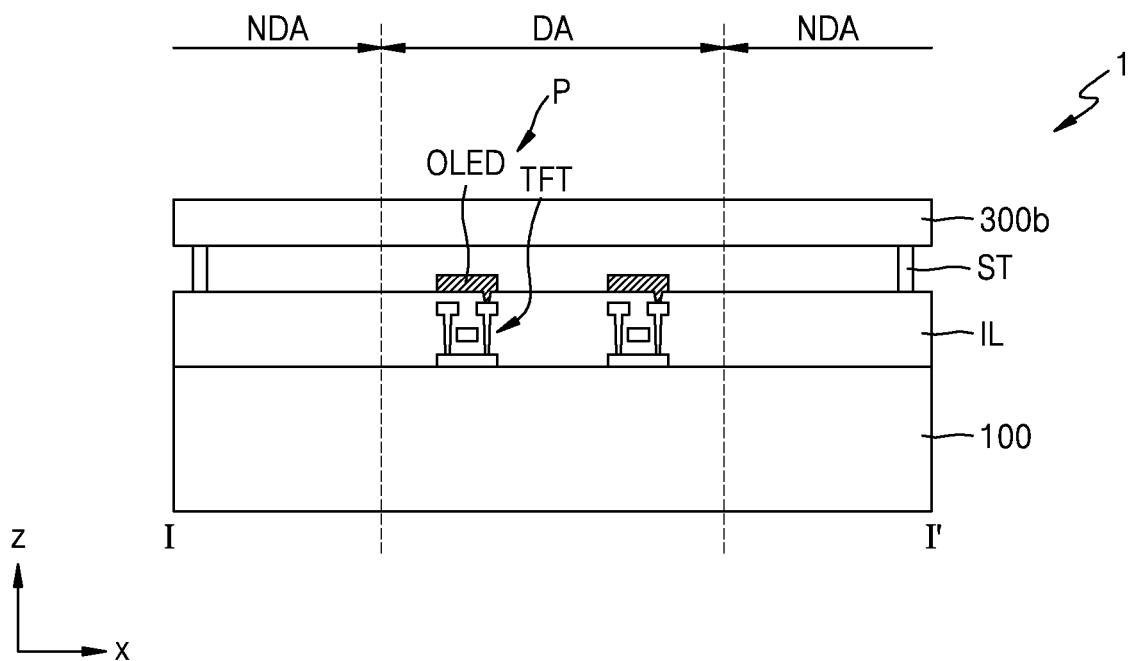

FIG. 3 and FIG. 4 are cross-sectional views of the display apparatus 1 according to some embodiments. FIGS. 3 and 4 show a cross-section of the display apparatus 1 taken along the line I-I' of FIG. 1.

Referring to FIG. 3, the display apparatus 1 according to an embodiment may include a substrate 100, an insulating layer IL on the substrate 100, an organic light-emitting diode OLED on the insulating layer IL, and a thin film encapsulation layer 300a covering the organic light-emitting diode OLED.

In an embodiment, the substrate 100 may include a polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, etc. The substrate 100 including the polymer resin may be flexible, rollable, or bendable. In an embodiment, the substrate 100 may have a multi-layered structure including a layer including the polymer resin described above and an inorganic layer (not shown).

In an embodiment, the substrate 100 may include a first substrate 100a, a first barrier layer 100b on the first substrate 100a, a second substrate 100c on the first barrier layer 100b, and a second barrier layer 100d on the second substrate 100c. For example, the first substrate 100a and the second substrate 100c may include polyimide.

A display element layer may be on the substrate 100. The display element layer may include a pixel circuit including a thin film transistor TFT, the organic light-emitting diode OLED that is a display element, and the insulating layer IL between the thin film transistor TFT and the organic light-emitting diode OLED. The display area DA may include pixels P each including the thin film transistor TFT and the organic light-emitting diode OLED connected to the thin film transistor TFT.

The organic light-emitting diode OLED may be covered by the thin film encapsulation layer 300a. In an embodiment, the thin film encapsulation layer 300a may include at least one inorganic encapsulation layer and at least one organic encapsulation layer. In this regard, FIG. 3 shows a first inorganic encapsulation layer 310 and a second inorganic encapsulation layer 330, and an organic encapsulation layer 320 between the first and second inorganic encapsulation layers 310 and 330.

The first and second inorganic encapsulation layers 310 and 330 may include one or more inorganic insulating materials from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, etc.

Referring to FIG. 4, in an embodiment, the substrate 100 may include a glass material mainly containing $SiO_2$, and an encapsulation substrate 300b may be on the substrate 100 to face the substrate 100. In an embodiment, the encapsulation substrate 300b may include a glass material mainly including $SiO_2$.

The encapsulation substrate 300b faces the substrate 100, and a sealant ST may be provided between the substrate 100 and the encapsulation substrate 300b. The sealant ST is at an edge of the substrate 100 and may surround (e.g., entirely surround) the display element layer between the substrate 100 and the encapsulation substrate 300b. From a direction perpendicular to an upper surface of the substrate 100 (or in a plan view), the display area DA may be surrounded (e.g., entirely surrounded) by the sealant ST.

Figure 5:
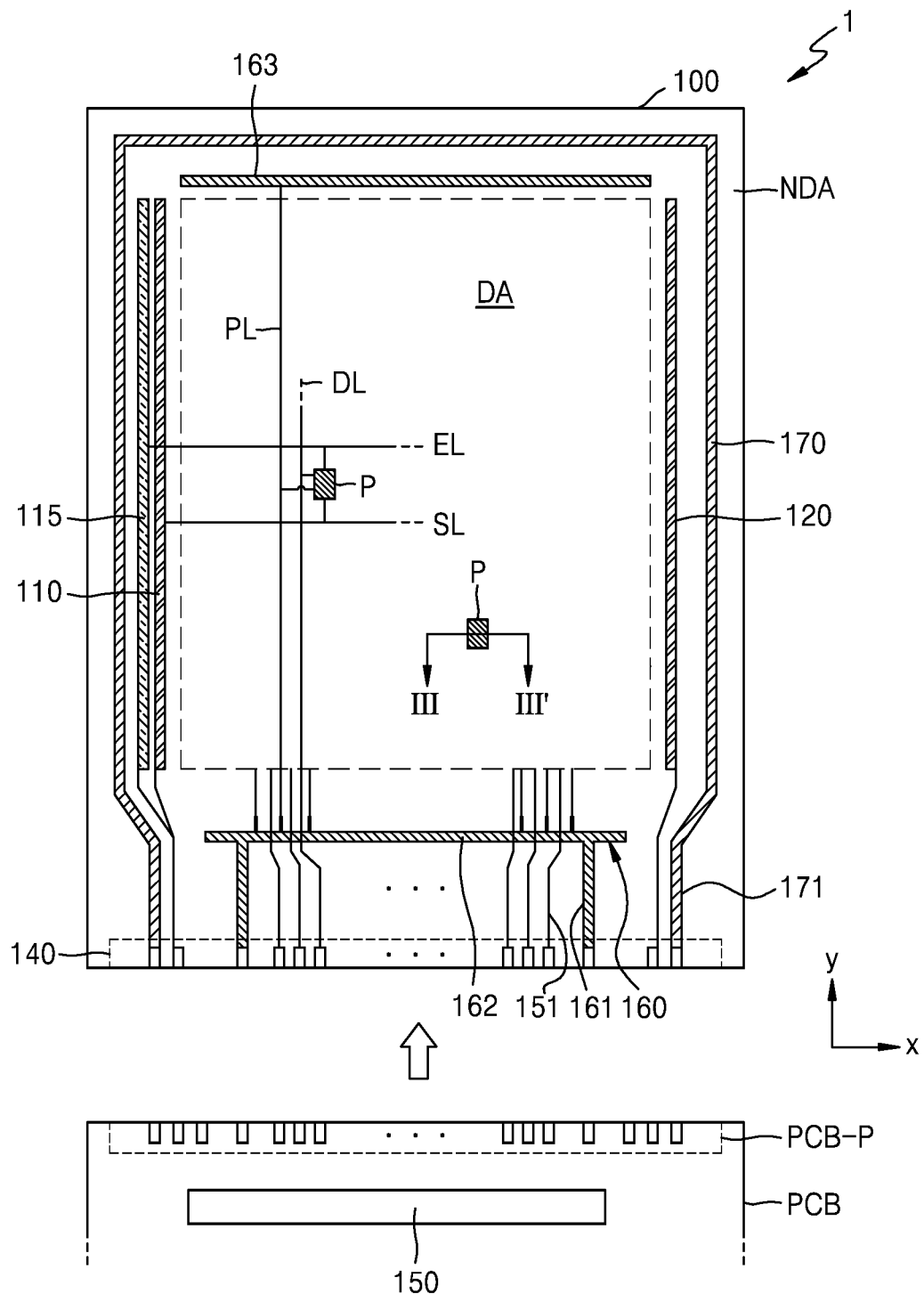
FIG. 5 is a plan view of a display apparatus according to an embodiment.

FIG. 5 is a plan view of the display apparatus 1 according to an embodiment.

Referring to FIG. 5, the display apparatus 1 includes a plurality of pixels P in the display area DA. Each of the plurality of pixels P may include a display element, such as an organic light-emitting diode OLED. Each of the plurality of pixels P may emit, for example, red light, green light, blue light, or white light from the organic light-emitting diode OLED. In an embodiment, the pixel P may emit red light, green light, blue light, or white light, as described above.

Each of the pixels P may be electrically connected to external circuits arranged in the non-display area NDA. In an embodiment, a first scan driving circuit 110, a first emission driving circuit 115, a second scan driving circuit 120, a terminal 140, a data driving circuit 150, a first power supply line 160, and a second power supply line 170 may be in the non-display area NDA.

The first scan driving circuit 110 may provide each pixel P with a scan signal via a scan line SL. The first emission driving circuit 115 may provide each of the pixels P with an emission control signal via an emission control line EL. In an embodiment, the second scan driving circuit 120 may be arranged in parallel with the first scan driving circuit 110 with the display area DA therebetween. Some of the pixels P arranged in the display area DA may be electrically connected to the first scan driving circuit 110, and the other pixels P may be electrically connected to the second scan driving circuit 120. In an embodiment, a second emission driving circuit (not shown) may be in parallel with the first emission driving circuit 115 with the display area DA therebetween.

The first emission driving circuit 115 is apart from the first scan driving circuit 110 in an x-direction in the non-display area NDA. In an embodiment, the first emission driving circuit 115 and the first scan driving circuit 110 may be alternately arranged in a y-direction.

The terminal 140 may be at a side of the substrate 100. The terminal 140 may not be covered by an insulating layer but is exposed and may be electrically connected to a printed circuit board PCB. A terminal PCB-P of the printed circuit board PCB may be electrically connected to the terminal 140 of the display apparatus 1. The printed circuit board PCB may transfer a signal or power from a controller (not shown) to the display apparatus 1. Control signals generated by the controller may be respectively transferred to the first and second scan driving circuits 110 and 120 and the first emission driving circuit 115 via the printed circuit board PCB. The controller may provide the first power supply line 160 and the second power supply line 170 with a first power voltage ELVDD and a second power voltage ELVSS respectively through a first connecting line 161 and a second connecting line 171. The first power voltage ELVDD is supplied to each pixel P via a driving voltage line PL connected to the first power supply line 160, and the second power voltage ELVSS may be provided to an opposite electrode of each pixel P connected to the second power supply line 170.

The data driving circuit 150 is electrically connected to a data line DL. A data signal of the data driving circuit 150 may be provided to each of the pixels P via a connecting line 151 connected to the terminal 140 and the data line DL connected to the connecting line 151.

Although FIG. 5 shows that the data driving circuit 150 is on the printed circuit board PCB, the data driving circuit 150 may be on the substrate 100 in another embodiment. For example, the data driving circuit 150 may be between the terminal 140 and the first power supply line 160. Also, the data driving circuit 150 may be bent about the bending axis BAX (see FIG. 2) described above and may be on a rear surface of the display apparatus 1 so as not to be visible from the front when bent.

In an embodiment, the first power supply line 160 may include a first sub-line 162 and a second sub-line 163 that extend in parallel with each other in an x-direction with the display area DA therebetween. In an embodiment, the second power supply line 170 has a loop shape having an open side and may partially surround the display area DA.

Figure 6:
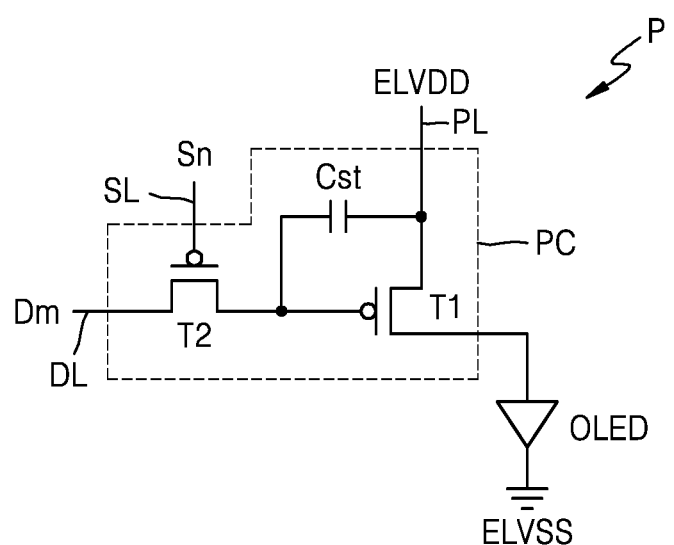
FIGS. 6 and 7 are equivalent circuit diagrams of a pixel included in a display apparatus according to some embodiments.
Figure 7:
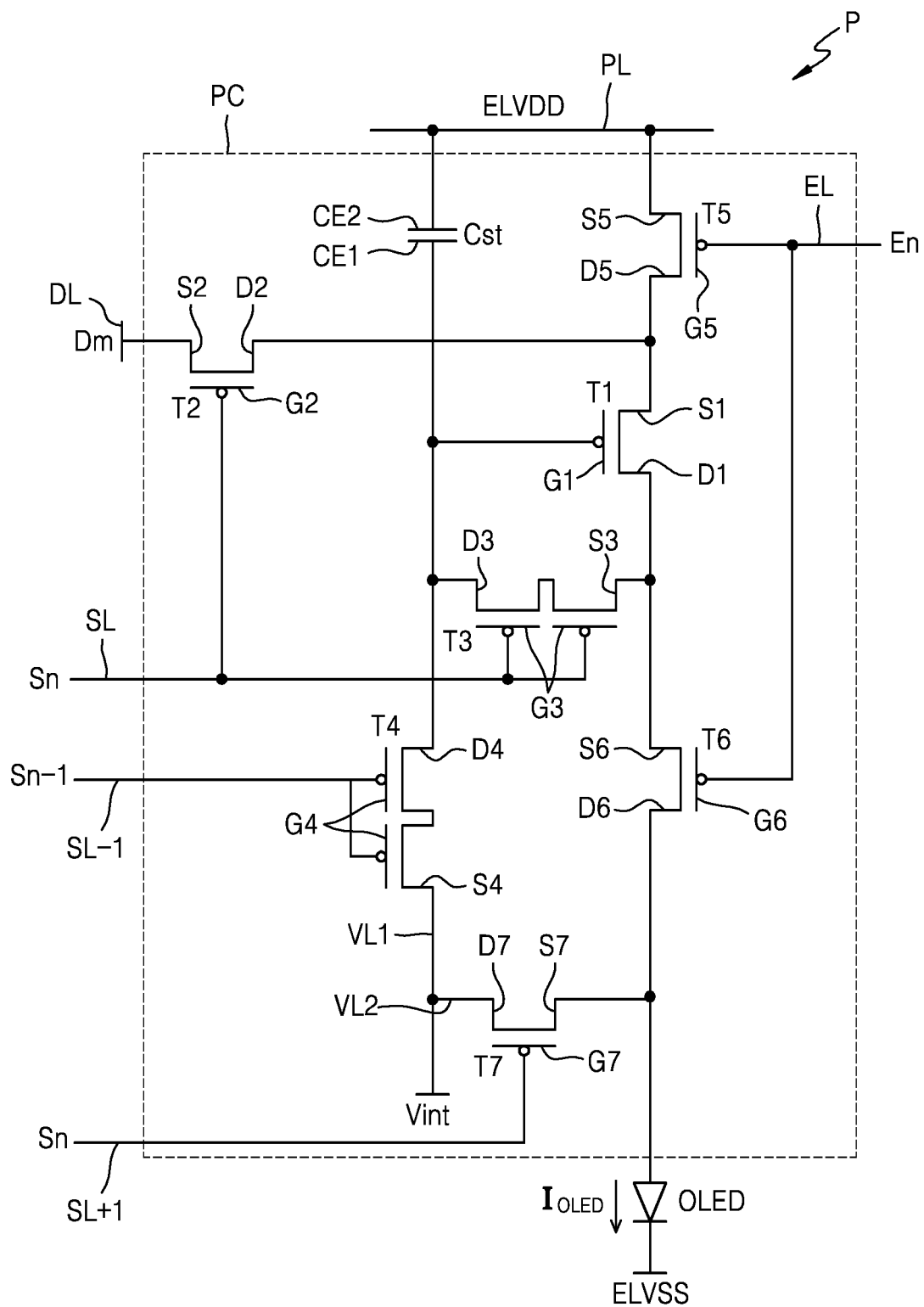

FIGS. 6 and 7 are equivalent circuit diagrams of the pixel P included in a display apparatus according to some embodiments.

Referring to FIG. 6, each pixel P includes a pixel circuit PC connected to a scan line SL and a data line DL, and the organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 according to a scan signal Sn input through the scan line SL.

The storage capacitor Cst is connected to the switching thin film transistor T2 and a driving voltage line PL and stores a voltage corresponding to a difference between a voltage transferred from the switching thin film transistor T2 and the first power voltage ELVDD (or driving voltage) supplied to the driving voltage line PL.

The driving thin film transistor T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a certain luminance according to the driving current.

FIG. 6 shows an example in which the pixel circuit PC includes two thin film transistors and one storage capacitor, but embodiments are not limited thereto. As shown in FIG. 7, in another embodiment, the pixel circuit PC may include seven thin film transistors and one storage capacitor.

Referring to FIG. 7, the pixel P includes the pixel circuit PC and the organic light-emitting diode OLED electrically connected to the pixel circuit PC. The pixel circuit PC may include a plurality of thin film transistors T1 to T7 and the storage capacitor Cst. The plurality of thin film transistors T1 to T7 and the storage capacitor Cst may be connected to signal lines SL, SL−1, SL+1, EL, and DL, a first initialization voltage line VL1, a second initialization voltage line VL2, and the driving voltage line PL.

The signal lines SL, SL−1, SL+1, EL, and DL may include a scan line SL configured to transfer a scan signal Sn, a previous scan line SL−1 configured to transfer a previous scan signal Sn−1 to a first initialization thin film transistor T4, a post scan line SL+1 configured to transfer the scan signal Sn to a second initialization thin film transistor T7, the emission control line EL configured to transfer an emission control signal En to an operation control thin film transistor T5 and an emission control thin film transistor T6, and the data line DL intersecting with the scan line SL and configured to transfer a data signal Dm. The driving voltage line PL may be configured to transfer the driving voltage ELVDD to the driving thin film transistor T1, a first initialization voltage line VL1 may be configured to transfer an initialization voltage Vint to the first initialization thin film transistor T4, and a second initialization voltage line VL2 may be configured to transfer the initialization voltage Vint to the second initialization thin film transistor T7.

A driving gate electrode G1 of the driving thin film transistor T1 is connected to a lower electrode CE1 of the storage capacitor Cst, a driving source electrode S1 of the driving thin film transistor T1 is connected to the lower driving voltage line PL via the operation control thin film transistor T5, and a driving drain electrode D1 of the driving thin film transistor T1 is electrically connected to a pixel electrode of the organic light-emitting diode OLED via the emission control thin film transistor T6. The driving thin film transistor T1 receives the data signal Dm according to a switching operation of the switching thin film transistor T2 to supply a driving current IDLED to the organic light-emitting diode OLED.

A switching gate electrode G2 of the switching thin film transistor T2 is connected to the scan line SL, a switching source electrode S2 of the switching thin film transistor T2 is connected to the data line DL, a switching drain electrode D2 of the switching thin film transistor T2 is connected to the driving source electrode S1 of the driving thin film transistor T1 and, at the same time, is connected to the driving voltage line PL at the lower side via the operation control thin film transistor T5. The switching thin film transistor T2 is turned on according to the scan signal Sn received through the scan line SL and performs a switching operation that transfers the data signal Dm transferred through the data line DL to the driving source electrode S1 of the driving thin film transistor T1.

A compensation gate electrode G3 of a compensation thin film transistor T3 is connected to the scan line SL, a compensation source electrode S3 of the compensation thin film transistor T3 is connected to the driving drain electrode D1 of the driving thin film transistor T1 and, at the same time, is connected to the pixel electrode of the organic light-emitting diode OLED via the emission control thin film transistor T6, and a compensation drain electrode D3 of the compensation thin film transistor T3 is connected to the lower electrode CE1 of the storage capacitor Cst, a first initialization drain electrode D4 of the first initialization thin film transistor T4, and the driving gate electrode G1 of the driving thin film transistor T1. The compensation thin film transistor T3 is turned on according to the scan signal Sn received through the scan line SL to electrically connect the driving gate electrode G1 and the driving drain electrode D1 of the driving thin film transistor T1 to each other and to diode-connect the driving thin film transistor T1.

A first initialization gate electrode G4 of the first initialization thin film transistor T4 is connected to the previous scan line SL−1, a first initialization source electrode S4 of the first initialization thin film transistor T4 is connected to the first initialization voltage line VL1, and a first initialization drain electrode D4 of the first initialization thin film transistor T4 is connected to the lower electrode CE1 of the storage capacitor Cst, the compensation drain electrode D3 of the compensation thin film transistor T3, and the driving gate electrode G1 of the driving thin film transistor T1. The first initialization thin film transistor T4 is turned on according to the previous scan signal Sn−1 transferred through the previous scan line SL−1 to transfer the initialization voltage Vint to the driving gate electrode G1 of the driving thin film transistor T1 and perform an initialization operation for initializing a voltage at the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL at the lower side, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are concurrently (e.g., simultaneously) turned on according to an emission control signal En transferred through the emission control line EL to transfer a driving voltage ELVDD to the organic light-emitting diode OLED and to allow a driving current IDLED to flow in the organic light-emitting diode OLED.

The second initialization gate electrode G7 of the second initialization thin film transistor T7 is connected to the post scan line SL+1, a second initialization source electrode S7 of the second initialization thin film transistor T7 is connected to the emission control drain electrode D6 and the pixel electrode of the organic light-emitting diode OLED, and a second initialization drain electrode D7 of the second initialization thin film transistor T7 is connected to the second initialization voltage line VL2.

In addition, the scan line SL and the post scan line SL+1 are electrically connected to each other, and a same scan signal Sn may be applied to the scan line SL and the post scan line SL+1. Therefore, the second initialization thin film transistor T7 is turned on according to the scan signal Sn transferred through the post scan line SL+1 and performs an operation of initializing the pixel electrode of the organic light-emitting diode OLED.

An upper electrode CE2 of the storage capacitor Cst is connected to the driving voltage line PL, and a common electrode of the organic light-emitting diode OLED is connected to the common voltage (second power voltage) ELVSS. Accordingly, the organic light-emitting diode OLED emits light by receiving the driving current IDLED from the driving thin-film transistor T1 to display images.

In FIG. 7, the compensation thin film transistor T3 and the first initialization thin film transistor T4 are shown having dual-gate electrodes, but the compensation thin film transistor T3 and the first initialization thin film transistor T4 may each have one gate electrode.

Figure 8:
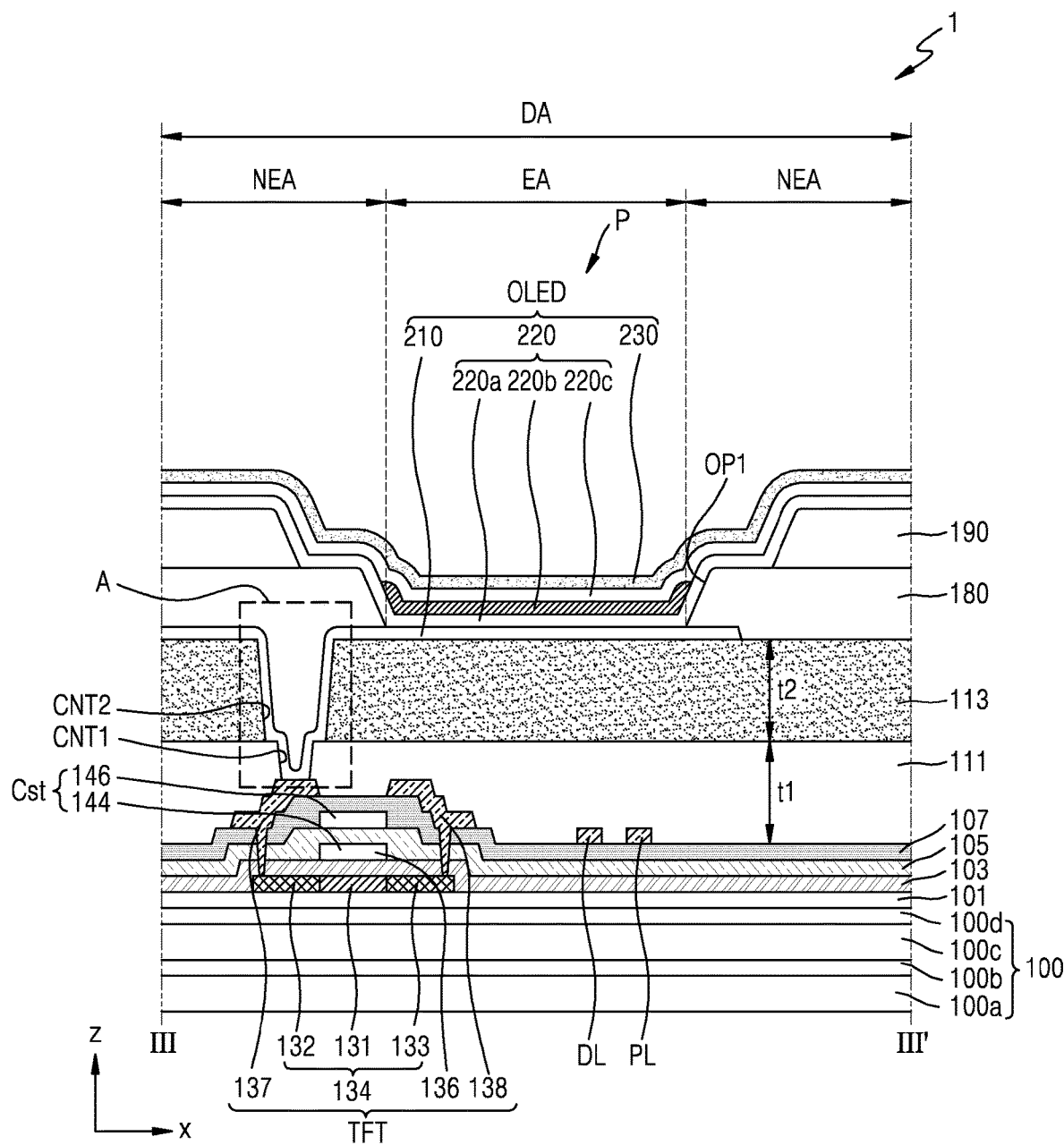
FIG. 8 is a cross-sectional view of a display apparatus according to an embodiment.
Figure 9:
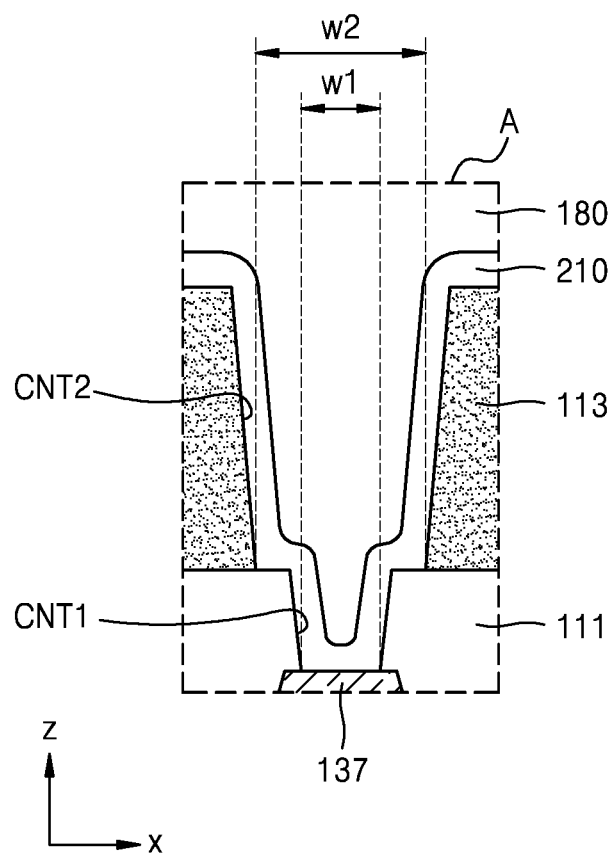
FIG. 9 is an enlarged view of a region "A" of the cross-sectional view of FIG. 8 according to an embodiment.

FIG. 8 is a cross-sectional view of the display apparatus 1 according to an embodiment; and FIG. 9 is an enlarged view of a region "A" of the cross-sectional view of FIG. 8. FIG. 8 is a cross-sectional view of the display apparatus 1 taken along the line III-III' of FIG. 5.

Referring to FIG. 8, in an embodiment, the substrate 100 may include a polymer resin. When the substrate 100 includes the polymer resin, the display apparatus 1 may be flexible, rollable, or bendable. In an embodiment, the substrate 100 may include the first substrate 100a, the first barrier layer 100b on the first substrate 100a, the second substrate 100c on the first barrier layer 100b, and the second barrier layer 100d on the second substrate 100c. For example, the first substrate 100a and the second substrate 100c may include polyimide.

A buffer layer 101 may be on the substrate 100 in the display area DA. The buffer layer 101 is on the substrate 100 to reduce or block infiltration of impurities, moisture, or external air from a lower portion of the substrate 100, and to provide a flat surface on the substrate 100. The buffer layer 101 may include an inorganic material, such as an oxide material or a nitride material, an organic material, or an inorganic-organic composite material, and may have a single-layered or multi-layered structure including the inorganic material and the organic material.

A thin film transistor TFT may be on the buffer layer 101. The thin film transistor TFT may include a semiconductor layer 134, a gate electrode 136 overlapping the semiconductor layer 134, and a connecting electrode electrically connected to the semiconductor layer 134. The thin film transistor TFT is connected to the organic light-emitting diode OLED to drive the organic light-emitting diode OLED.

The semiconductor layer 134 is on the buffer layer 101, and may include a channel region 131 overlapping with the gate electrode 136, and a source region 132 and a drain region 133 at opposite sides of the channel region 131 and having impurities of higher concentration than that of the channel region 131. Here, the impurities may include N-type impurities or P-type impurities. The source region 132 and the drain region 133 may be electrically connected to the connecting electrode.

The semiconductor layer 134 may include an oxide semiconductor and/or a silicon semiconductor. When the semiconductor layer 134 includes an oxide semiconductor, the semiconductor layer 134 may include an oxide material of at least one selected from the group consisting of, for example, indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the active layer 134 may include ITZO (InSnZnO), IGZO (InGaZnO), etc. When the semiconductor layer 134 includes a silicon semiconductor, the semiconductor layer 134 may include, for example, amorphous silicon (a-Si) or low temperature poly-silicon (LPTS) obtained by crystallizing a-Si.

A first insulating layer 103 may be on the semiconductor layer 134. In an embodiment, the first insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single-layered or a multi-layered structure including the inorganic insulating material.

The gate electrode 136 may be on the first insulating layer 103. In an embodiment, the gate electrode 136 may have a single or multi-layered structure including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line that applies an electrical signal to the gate electrode 136. The semiconductor layer 134 and the gate electrode 136 may be insulated from each other via the first insulating layer 103.

A second insulating layer 105 may be on the gate electrode 136. In an embodiment, the second insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single-layered or a multi-layered structure including the inorganic insulating material.

The storage capacitor Cst may be on the first insulating layer 103. The storage capacitor Cst may include a lower electrode 144 and an upper electrode 146 overlapping the lower electrode 144. The lower electrode 144 of the storage capacitor Cst overlaps the gate electrode 136 of the thin film transistor TFT, and, in an embodiment, the lower electrode 144 of the storage capacitor Cst may be integrally provided with the gate electrode 136 of the thin film transistor TFT. In an embodiment, the storage capacitor Cst may not overlap the thin-film transistor TFT, and the lower electrode 144 of the storage capacitor Cst may be an independent element separate from the gate electrode 136 of the thin-film transistor TFT.

The upper electrode 146 of the storage capacitor Cst may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single-layered or multi-layered structure including any of the above materials.

A third insulating layer 107 may be on the upper electrode 146. In an embodiment, the third insulating layer 107 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single-layered or a multi-layered structure including the inorganic insulating material.

The data line DL, the driving voltage line PL, a source electrode 137, and a drain electrode 138 that are connecting electrodes may be on the third insulating layer 107.

The data line DL, the driving voltage line PL, the source electrode 137, and the drain electrode 138 may each include a conductive material including molybdenum (Mo), aluminum (Al), copper (Cu), titanium (Ti), etc., and may have a single-layered or multi-layered structure including the above materials. In an embodiment, the data line DL, the driving voltage line PL, the source electrode 137, and the drain electrode 138 may each have a multi-layered structure including Ti/Al/Ti. In an embodiment, the data line DL, the driving voltage line PL, the source electrode 137, and the drain electrode 138 may include the same material.

The gate electrode 136, and the source electrode 137 and the drain electrode 138 that are the connecting electrodes may be insulated from each other via the second insulating layer 105 and the third insulating layer 107.

The data line DL, the driving voltage line PL, the source electrode 137, and the drain electrode 138 may be covered by a first transparent planarization layer 111. The first transparent planarization layer 111 may include a single-layered or multi-layered structure including an organic material or an inorganic material. The first transparent planarization layer 111 may include a general universal polymer such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In addition, the first transparent planarization layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. In an embodiment, after arranging the first transparent planarization layer 111, a chemical and mechanical polishing may be performed to provide a flat upper surface. In an embodiment, the first transparent planarization layer 111 may include a transparent material to be transparent. For example, the first transparent planarization layer 111 may include transparent polyimide. In addition, the first transparent planarization layer 111 may include a positive photosensitive material.

The first transparent planarization layer 111 may be on the third insulating layer 107 to a first thickness t1 from an upper surface of the third insulating layer 107. In an embodiment, the first thickness t1 may be about 0.5 μm to about 2 μm, about 0.6 μm to about 1.8 μm, about 0.8 μm to about 1.5 μm, etc.

Referring to FIG. 9, the first transparent planarization layer 111 may include a first contact hole CNT1 for electrically connecting the thin film transistor TFT to a pixel electrode 210 of the organic light-emitting diode OLED. The thin film transistor TFT and the organic light-emitting diode OLED of the display apparatus may be electrically connected to each other via the first contact hole CNT1 defined in the first transparent planarization layer 111. The first contact hole CNT1 defined in the first transparent planarization layer 111 may have a first width w1. In an embodiment, the first width w1 may be about 3 μm to about 5 μm, about 2.7 μm to about 5.3 μm, about 2.5 μm to about 5.5 μm, etc.

Referring back to FIG. 8, a colored planarization layer 113 may be on the first transparent planarization layer 111. In an embodiment, the colored planarization layer 113 may be directly on the first transparent planarization layer 111. The colored planarization layer 113 may include a colored material. For example, the colored planarization layer 113 may include a colored pigment, e.g., a pigment of a certain color, such as white or black. In an embodiment, the colored planarization layer 113 may be black. For example, the colored planarization layer 113 may include a polyimide (PI)-based binder, and a pigment in which red, green, and blue colors are mixed. In another embodiment, the colored planarization layer 113 may include a cardo-based binder resin and a mixture of a lactam black pigment and a blue pigment. In another embodiment, the colored planarization layer 113 may include carbon black.

Because the colored planarization layer 113 is obtained from a colored material layer 113M (see FIG. 15E) that will be described later, the colored planarization layer 113 may have a negative photosensitive property and may prevent or substantially prevent external light from being reflected due to a colored pigment. The colored planarization layer 113 including the colored pigment may prevent or substantially prevent reflection of the external light proceeding from the outside towards the display apparatus, may improve a contrast of the display apparatus, and may prevent or substantially prevent oxidation of an opposite electrode 230 due to gases that are generated due to photolysis of materials in the first transparent planarization layer 111 generated by the external light.

The colored planarization layer 113 may be on the first transparent planarization layer 111 to a second thickness t2 from an upper surface of the first transparent planarization layer 111. In an embodiment, the second thickness t2 may be about 0.5 μm to about 2 μm, about 0.6 μm to about 1.8 μm, about 0.8 μm to about 1.5 μm, etc.

In an embodiment, the first thickness t1 of the first transparent planarization layer 111 and the second thickness t2 of the colored planarization layer 113 may be equal to each other. In another embodiment, the first thickness t1 of the first transparent planarization layer 111 may be different from the second thickness t2 of the colored planarization layer 113.

Referring to FIG. 9, the colored planarization layer 113 may include a second contact hole CNT2 for electrically connecting the thin film transistor TFT to the pixel electrode 210 of the organic light-emitting diode OLED. The thin film transistor TFT and the organic light-emitting diode OLED of the display apparatus 1 may be electrically connected to each other via the second contact hole CNT2 defined in the colored planarization layer 113. The second contact hole CNT2 defined in the colored planarization layer 113 may have a second width w2 that is different from the first width w1 of the first contact hole CNT1 defined in the first transparent planarization layer 111. In an embodiment, the second width w2 may be about 5 μm to about 7 μm, about 6 μm to about 10 μm, about 4.5 μm to about 7.5 μm, etc. For example, the second contact hole CNT2 defined in the colored planarization layer 113 may have the second width w2 that is greater than the first width w1 of the first contact hole CNT1 defined in the first transparent planarization layer 111. When the second contact hole CNT2 defined in the colored planarization layer 113 has a greater width than that of the first contact hole CNT1 defined in the first transparent planarization layer 111, the pixel electrode 210 may be stably connected to the source electrode 137 or the drain electrode 138, that is, the connecting electrode.

In an embodiment, the first contact hole CNT1 in the first transparent planarization layer 111 and the second contact hole CNT2 in the colored planarization layer 113 may overlap with each other in a direction perpendicular to the substrate 100, that is, a z-direction. In an embodiment, the first contact hole CNT1 in the first transparent planarization layer 111 and the second contact hole CNT2 in the colored planarization layer 113 may completely overlap with each other in the z-direction. For example, a minimum width of the second contact hole CNT2 in the colored planarization layer 113 may be greater than a maximum width of the first contact hole CNT1 in the first transparent planarization layer 111, and the second contact hole CNT2 of the colored planarization layer 113 may surround the first contact hole CNT1 in the first transparent planarization layer 111 in a plan view.

Referring back to FIG. 8, the organic light-emitting diode OLED including the pixel electrode 210, an intermediate layer 220, and the opposite electrode 230 may be on the colored planarization layer 113. The pixel electrode 210 may be electrically connected to the source electrode 137 or the drain electrode 138 via the first contact hole CNT1 defined in the first transparent planarization layer 111 and the second contact hole CNT2 defined in the colored planarization layer 113. That is, the organic light-emitting diode OLED may be electrically connected to the thin film transistor TFT via the first contact hole CNT1 defined in the first transparent planarization layer 111 and the second contact hole CNT2 defined in the colored planarization layer 113.

The pixel electrode 210 may be on the colored planarization layer 113. The pixel electrode 210 may include a (semi-) transmissive electrode or a reflective electrode. In an embodiment, the pixel electrode 210 may include a reflective layer including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). In an embodiment, the pixel electrode 210 may include a stack structure including ITO/Ag/ITO.

A pixel defining layer 180 may be on the colored planarization layer 113, and the pixel defining layer 180 may include a first opening OP1 that at least partially exposes the pixel electrode 210. A region exposed by the first opening OP1 of the pixel defining layer 180 may be defined as an emission area EA. A periphery of the emission areas EA is a non-emission area NEA, and the non-emission area NEA may surround the emission areas EA. That is, the display area DA includes a plurality of emission areas EA and the non-emission area NEA surrounding the emission areas EA. The pixel defining layer 180 increases a distance between the pixel electrode 210 and the opposite electrode 230 on the pixel electrode 210 to prevent or substantially prevent generation of an arc at the edge of the pixel electrode 210. The pixel defining layer 180 may include, for example, an organic insulating material, such as polyimide, polyamide, an acrylic resin, benzocyclobutene, hexamethyldisiloxane (HMDSO), and a phenol resin, and may be obtained by spin coating, etc.

In an embodiment, a spacer 190 may be on the pixel defining layer 180. The spacer 190 may prevent or substantially prevent layers between the substrate 100 and the spacer 190 from being damaged due to a mask that is used in a process of forming the intermediate layer 220 that will be described later. The spacer 190 may include a same material as that of the pixel defining layer 180 and may be obtained concurrently (e.g., simultaneously) with the pixel defining layer 180 by using a half-tone mask.

The intermediate layer 220 may be in the first opening OP1 of the pixel defining layer 180 to correspond to the pixel electrode 210. In an embodiment, the intermediate layer 220 may include an emission layer 220b, and a first functional layer 220a and a second functional layer 220c may be selectively provided under and on the emission layer 220b.

In an embodiment, the first functional layer 220a may include a hole injection layer (HIL) and/or a hole transport layer (HTL), and the second functional layer 220c may include an electron transport layer (ETL) and/or an electron injection layer (EIL).

In an embodiment, the emission layer 220b may include an organic material including a fluorescent or phosphor material emitting red, green, blue, or white light. The emission layer 220b may include low-molecular weight organic materials or polymer materials.

When the emission layer 220b includes a low-molecular weight organic material, the intermediate layer 220 may include an HIL, an HTL, the emission layer 220b, an ETL, and an EIL in a single or multiple-layered structure, and examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). In an embodiment, the above layers may be manufactured by a vacuum deposition method.

When the emission layer 220b includes a polymer organic material, the intermediate layer 220 may include an HTL and the emission layer 220b. Here, the HTL may include PEDOT, and the emission layer may include a poly-phenylenevinylene (PPV)-based or polyfluorene-based polymer material. The light-emitting layer may be arranged by using a screen printing method, an inkjet printing method, a laser induced thermal imaging (LITI) method, etc.

In an embodiment, the first functional layer 220a and the second functional layer 220c under and on the emission layer 220b may be integrally provided throughout the entire substrate 100 so as to cover the plurality of pixels P in the display area DA by using an open mask.

The opposite electrode 230 may be on the intermediate layer 220. In an embodiment, the opposite electrode 230 is on the intermediate layer 220, and the opposite electrode 230 may entirely cover the intermediate layer 220. In an embodiment, the opposite electrode 230 may be on the display area DA and may entirely cover the display area DA. That is, in an embodiment, the opposite electrode 230 may be integrally provided throughout the entire substrate 100 so as to cover the plurality of pixels P in the display area DA by using an open mask.

The opposite electrode 230 may include a conductive material having a low work function. For example, the opposite electrode 230 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In an embodiment, the opposite electrode 230 may further include a layer including ITO, IZO, ZnO, or $In_2O_3$ on the (semi-) transparent layer including the above material.

Figure 10:
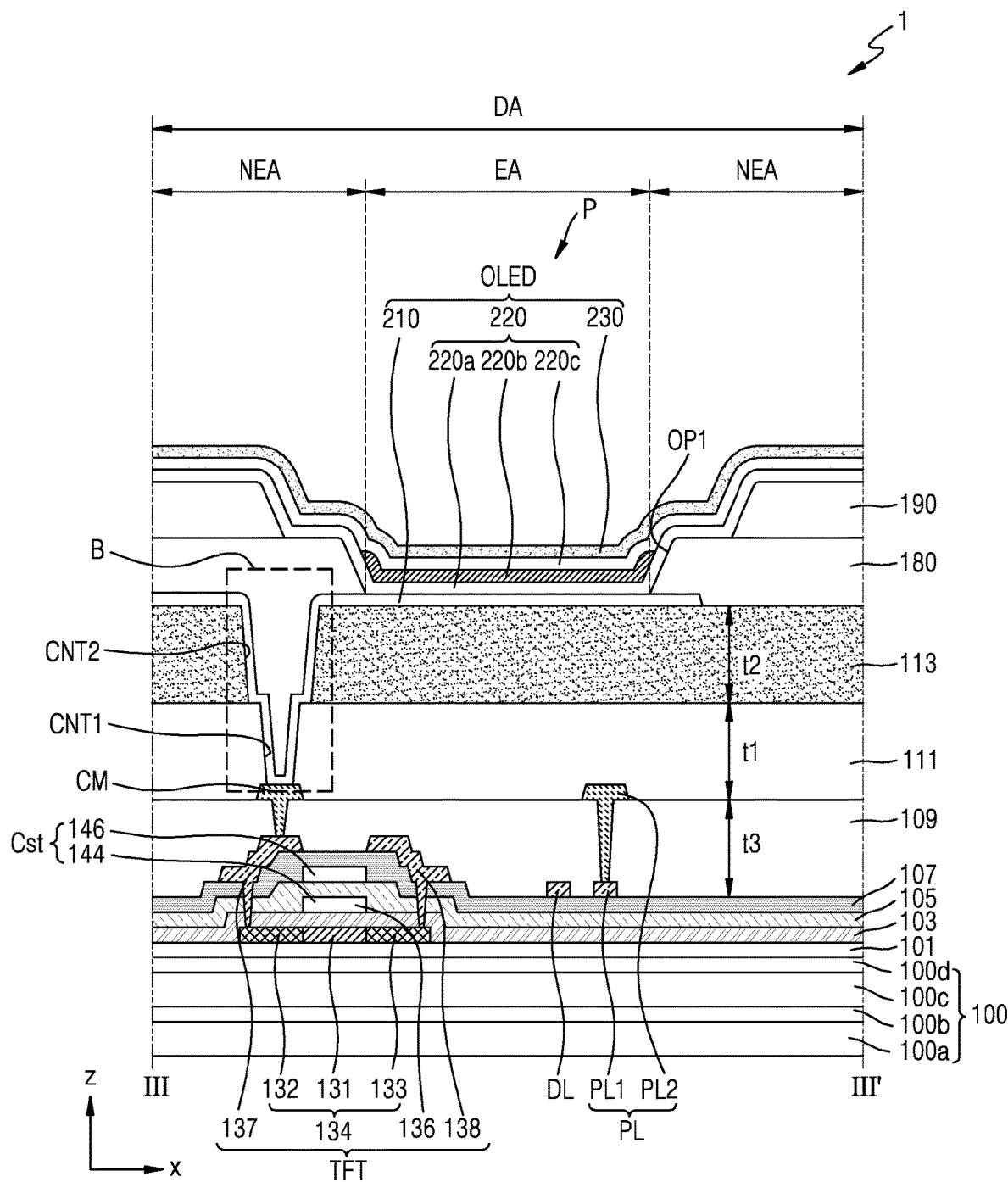
FIG. 10 is a cross-sectional view of a display apparatus according to an embodiment.
Figure 11:
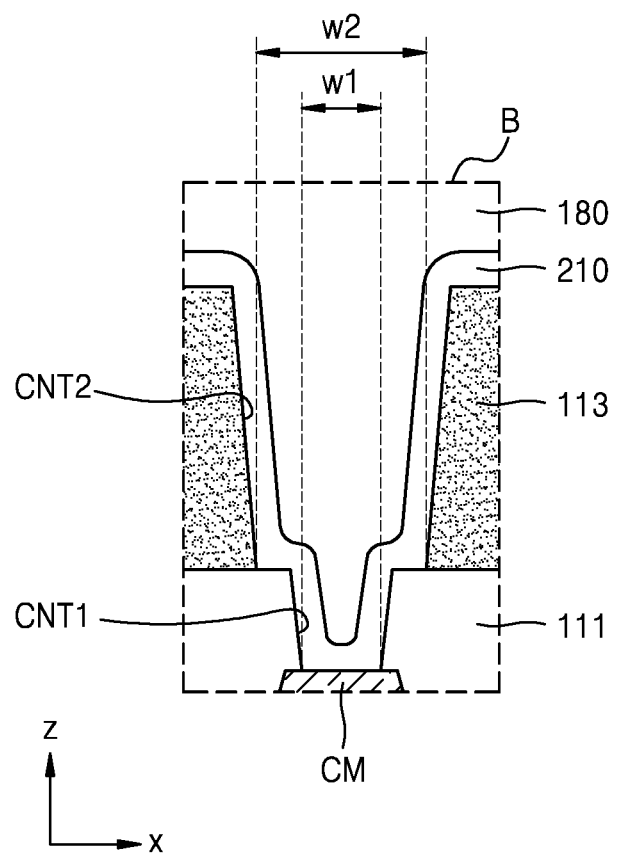
FIG. 11 is an enlarged view of a region "B" of the cross-sectional view of FIG. 10 according to an embodiment.

FIG. 10 is a cross-sectional view of the display apparatus 1 according to an embodiment; and FIG. 11 is an enlarged view of a region "B" of the cross-sectional view of FIG. 10.

The embodiment illustrated with reference to FIG. 10 is different from that of FIG. 8, in that a second transparent planarization layer 109 is further provided between the substrate 100 and the first transparent planarization layer 111, and an upper driving voltage line PL2 is on the second transparent planarization layer 109. With respect to FIG. 10, descriptions of elements that are the same as those of FIG. 8 may be omitted, and differences from FIG. 8 will be mainly described below.

Referring to FIG. 10, the data line DL, a lower driving voltage line PL1, and the source electrode 137 and the drain electrode 138 that are the connecting electrodes may be on the third insulating layer 107.

The data line DL, the lower driving voltage line PL1, and the source and drain electrodes 137 and 138, e.g., the connecting electrodes, may be covered by the second transparent planarization layer 109. The second transparent planarization layer 109 may include a single-layered or multi-layered structure including an organic material or an inorganic material. The second transparent planarization layer 109 may include a general universal polymer, such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In addition, the second transparent planarization layer 109 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. In an embodiment, after arranging the second transparent planarization layer 109, a chemical and mechanical polishing may be performed to provide a flat upper surface. The second transparent planarization layer 109 may include a transparent material. For example, the second transparent planarization layer 109 may include transparent polyimide. In addition, the second transparent planarization layer 109 may include a positive photosensitive material.

The second transparent planarization layer 109 may be on the third insulating layer 107 to a third thickness t3 from an upper surface of the third insulating layer 107. In an embodiment, the third thickness t3 may be about 0.5 μm to about 2 μm, about 0.6 μm to about 1.8 μm, about 0.8 μm to about 1.5 μm, etc.

The upper driving voltage line PL2 and a contact metal layer CM may be on the second transparent planarization layer 109. The upper driving voltage line PL2 and the contact metal layer CM may each include aluminum (Al), copper (Cu), titanium (Ti), etc. and may have a single-layered or multi-layered structure. In an embodiment, the upper driving voltage line PL2 and the contact metal layer CM may each have a multi-layered structure including Ti/Al/Ti. In an embodiment, the upper driving voltage line PL2 and the contact metal layer CM may include the same material.

The upper driving voltage line PL2 may be electrically connected to the lower driving voltage line PL1 via a contact hole penetrating through the second transparent planarization layer 109 to prevent or substantially prevent voltage dropping of the driving voltage ELVDD provided through the driving voltage line PL. The contact metal layer CM may be electrically connected to the thin film transistor TFT via a contact hole penetrating through the second transparent planarization layer 109.

The first transparent planarization layer 111 may be on the upper driving voltage line PL2 and the contact metal layer CM. The first transparent planarization layer 111 may include a single-layered or multi-layered structure including an organic material or an inorganic material. The first transparent planarization layer 111 may include a general universal polymer, such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In addition, the first transparent planarization layer 111 may include silicon oxide ($SiO_2$), silicon nitride ($SiNx$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. In an embodiment, after arranging the first transparent planarization layer 111, a chemical and mechanical polishing may be performed to provide a flat upper surface. In an embodiment, the first transparent planarization layer 111 may include transparent polyimide and a positive photosensitive material. For example, the first transparent planarization layer 111 may include the same material as that of the second transparent planarization layer 109.

The first transparent planarization layer 111 may be on the second transparent planarization layer 109 to the first thickness t1 from the upper surface of the second transparent planarization layer 109. In an embodiment, the first thickness t1 may be about 0.5 μm to about 2 μm, about 0.6 μm to about 1.8 μm, about 0.8 μm to about 1.5 μm, etc.

Referring to FIG. 11, the first transparent planarization layer 111 may include a first contact hole CNT1 for electrically connecting the thin film transistor TFT to a pixel electrode 210. The thin film transistor TFT and the organic light-emitting diode OLED of the display apparatus may be electrically connected to each other via the first contact hole CNT1 defined in the first transparent planarization layer 111. The first contact hole CNT1 defined in the first transparent planarization layer 111 may have the first width w1. In an embodiment, the first width w1 may be about 3 μm to about 5 μm, about 2.7 μm to about 5.3 μm, about 2.5 μm to about 5.5 μm, etc.

Referring back to FIG. 10, the colored planarization layer 113 may be on the first transparent planarization layer 111. In an embodiment, the colored planarization layer 113 may be directly on the first transparent planarization layer 111. The colored planarization layer 113 may include a colored material. For example, the colored planarization layer 113 may include a colored pigment, e.g., a pigment of a certain color, such as white or black. In an embodiment, the colored planarization layer 113 may be black. For example, the colored planarization layer 113 may include a polyimide (PI)-based binder, and a pigment in which red, green, and blue colors are mixed. In another embodiment, the colored planarization layer 113 may include a cardo-based binder resin and a mixture of a lactam black pigment and a blue pigment. In another embodiment, the colored planarization layer 113 may include carbon black.

Because the colored planarization layer 113 is obtained from a colored material layer 113M (see FIG. 15E) that will be described later, the colored planarization layer 113 may have a negative photosensitive property and may prevent or substantially prevent external light from being reflected due to a colored pigment. The colored planarization layer 113 including the colored pigment may prevent or substantially prevent reflection of the external light proceeding from the outside towards the display apparatus, may improve contrast of the display apparatus, and may prevent or substantially prevent oxidation of the opposite electrode 230 due to gases that are generated due to photolysis of materials in the first transparent planarization layer 111 generated by the external light.

The colored planarization layer 113 may be on the first transparent planarization layer 111 to the second thickness t2 from the upper surface of the first transparent planarization layer 111. In an embodiment, the second thickness t2 may be about 0.5 μm to about 2 μm, about 0.6 μm to about 1.8 μm, about 0.8 μm to about 1.5 μm, etc.

The first thickness t1 of the first transparent planarization layer 111, the second thickness t2 of the colored planarization layer 113, and the third thickness t3 of the second transparent planarization layer 109 may be equal to one another. For example, the first thickness t1 of the first transparent planarization layer 111, the second thickness t2 of the colored planarization layer 113, and the third thickness t3 of the second transparent planarization layer 109 may be different from one another.

Referring to FIG. 11, the colored planarization layer 113 may include a second contact hole CNT2 for electrically connecting the thin film transistor TFT to the pixel electrode 210. The thin film transistor TFT and the organic light-emitting diode OLED of the display apparatus may be electrically connected to each other via the second contact hole CNT2 defined in the colored planarization layer 113. The second contact hole CNT2 defined in the colored planarization layer 113 may have the second width w2 that is different from the first width w1 of the first contact hole CNT1 defined in the first transparent planarization layer 111. In an embodiment, the second width w2 may be about 5 μm to about 7 μm, about 6 μm to about 10 μm, about 4.5 μm to about 7.5 μm, etc. For example, the second contact hole CNT2 defined in the colored planarization layer 113 may have the second width w2 that is greater than the first width w1 of the first contact hole CNT1 defined in the first transparent planarization layer 111. In an embodiment, the second contact hole CNT2 defined in the colored planarization layer 113 has a greater width than that of the first contact hole CNT1 defined in the first transparent planarization layer 111, and, thus, the pixel electrode 210 may be stably connected to the contact metal layer CM and the thin film transistor TFT may be electrically connected to the pixel electrode 210.

In an embodiment, the first contact hole CNT1 in the first transparent planarization layer 111 and the second contact hole CNT2 in the colored planarization layer 113 may overlap with each other in a direction perpendicular to the substrate 100, that is, a z-direction. In an embodiment, the first contact hole CNT1 in the first transparent planarization layer 111 and the second contact hole CNT2 in the colored planarization layer 113 may completely overlap with each other in the z-direction. For example, a minimum width of the second contact hole CNT2 in the colored planarization layer 113 may be greater than a maximum width of the first contact hole CNT1 in the first transparent planarization layer 111, and the second contact hole CNT2 of the colored planarization layer 113 may surround the first contact hole CNT1 in the first transparent planarization layer 111 in a plan view.

Figure 12:
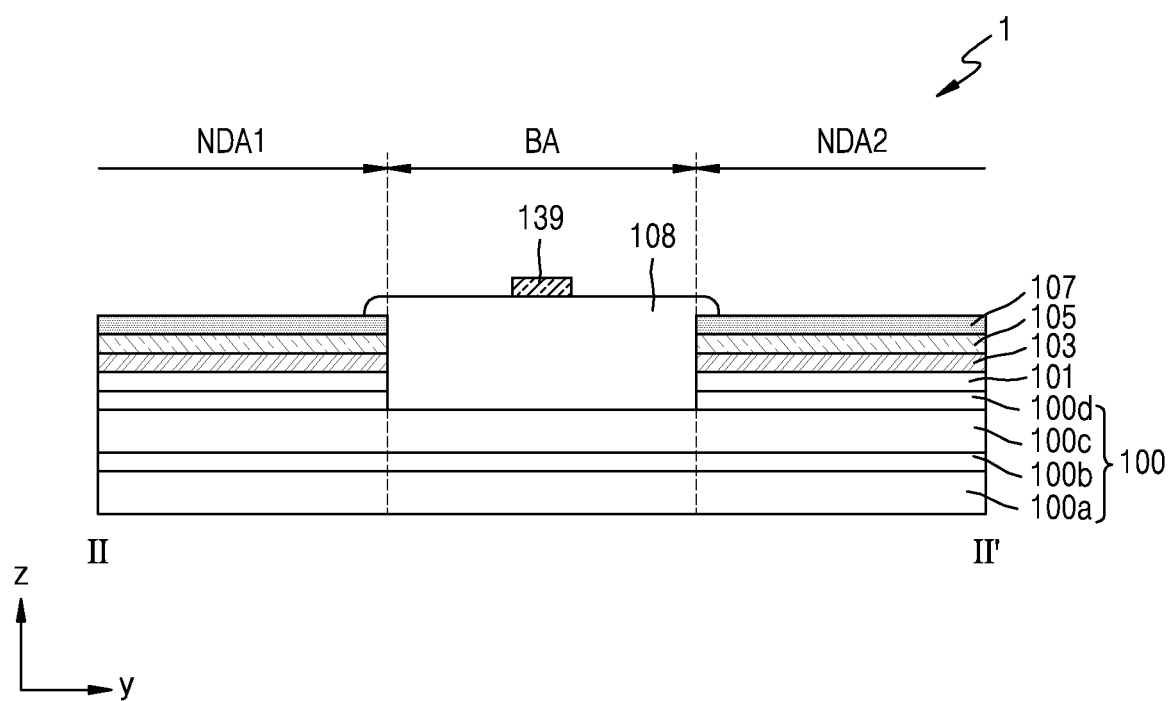
FIG. 12 is a cross-sectional view of a display apparatus according to an embodiment.

FIG. 12 is a cross-sectional view of the display apparatus 1 according to an embodiment. FIG. 12 shows a cross-section of the display apparatus 1 taken along the line II-II' of FIG. 2.

Referring to FIG. 12, the first non-display area NDA1 and the second non-display area NDA2 may be defined based on the bending area BA. In an embodiment, the substrate 100 may include the first substrate 100a, the first barrier layer 100b on the first substrate 100a, the second substrate 100c on the first barrier layer 100b, and the second barrier layer 100d on the second substrate 100c. For example, the first substrate 100a and the second substrate 100c may include polyimide. The buffer layer 101 may be on the substrate 100 in the first non-display area NDA1 and the second non-display area NDA2. The buffer layer 101 may be on the substrate 100 to reduce or block infiltration of impurities, moisture, or external air from a lower portion of the substrate 100, and to provide a flat surface on the substrate 100. The buffer layer 101 may include an inorganic material such as an oxide material or a nitride material, an organic material, or an inorganic-organic composite material, and may have a single-layered or multi-layered structure including the inorganic material and the organic material.

The first insulating layer 103 may be on the buffer layer 101 in the first non-display area NDA1 and the second non-display area NDA2. In an embodiment, the first insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single-layered or a multi-layered structure including the inorganic insulating material. Although not shown in the drawings, the first insulating layer 103 on the first non-display area NDA1 and the second non-display area NDA2 may at least partially extend onto the bending area BA, and the first insulating layer 103 may be on a part of the bending area BA.

The second insulating layer 105 may be on the first insulating layer 103 in the first non-display area NDA1 and the second non-display area NDA2. In an embodiment, the second insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single-layered or a multi-layered structure including the inorganic insulating material. Although not shown in the drawings, the second insulating layer 105 on the first non-display area NDA1 and the second non-display area NDA2 may at least partially extend onto the bending area BA, and the second insulating layer 105 may be on a part of the bending area BA.

The third insulating layer 107 may be on the second insulating layer 105 in the first non-display area NDA1 and the second non-display area NDA2. In an embodiment, the third insulating layer 107 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single-layered or a multi-layered structure including the inorganic insulating material. Although not shown in the drawings, the third insulating layer 107 on the first non-display area NDA1 and the second non-display area NDA2 may at least partially extend onto the bending area BA, and the third insulating layer 107 may be on a part of the bending area BA.

In an embodiment, an organic material layer 108 may be on the substrate 100 in the bending area BA. The organic material layer 108 may include a general universal polymer, such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In an embodiment, the organic material layer 108 may include the same material as that of the first transparent planarization layer 111 (see FIG. 8) or that of the second transparent planarization layer 109 (see FIG. 10).

A first conductive layer 139 may be on the organic material layer 108 in the bending area BA. The first conductive layer 139 may include the same material as that of the source electrode 137 (see FIG. 8) or the drain electrode 138 (see FIG. 8).

In an embodiment, after forming the buffer layer 101, the first insulating layer 103, the second insulating layer 105, and the third insulating layer 107 integrally on the bending area BA, the first non-display area NDA1, and the second non-display area NDA2, the buffer layer 101, the first insulating layer 103, the second insulating layer 105, and the third insulating layer 107 may be removed. For example, during a process of removing the buffer layer 101, the first insulating layer 103, the second insulating layer 105, and the third insulating layer 107 on the bending area BA, the second barrier layer 100d may be also removed.

The organic material layer 108 on the bending area BA may at least partially extend towards the first non-display area NDA1 and the second non-display area NDA2. Therefore, the organic material layer 108 may be at least partially on the first non-display area NDA1 and the second non-display area NDA2.

When the insulating layers including the inorganic insulating material are removed from the bending area BA and the organic material layer 108 including the organic insulating material is on the bending area BA, propagation of cracks towards the display area DA may be prevented or substantially prevented and a deformation rate on the bending area BA may be improved, and, thus, the display apparatus having improved reliability may be implemented.

Figure 13:
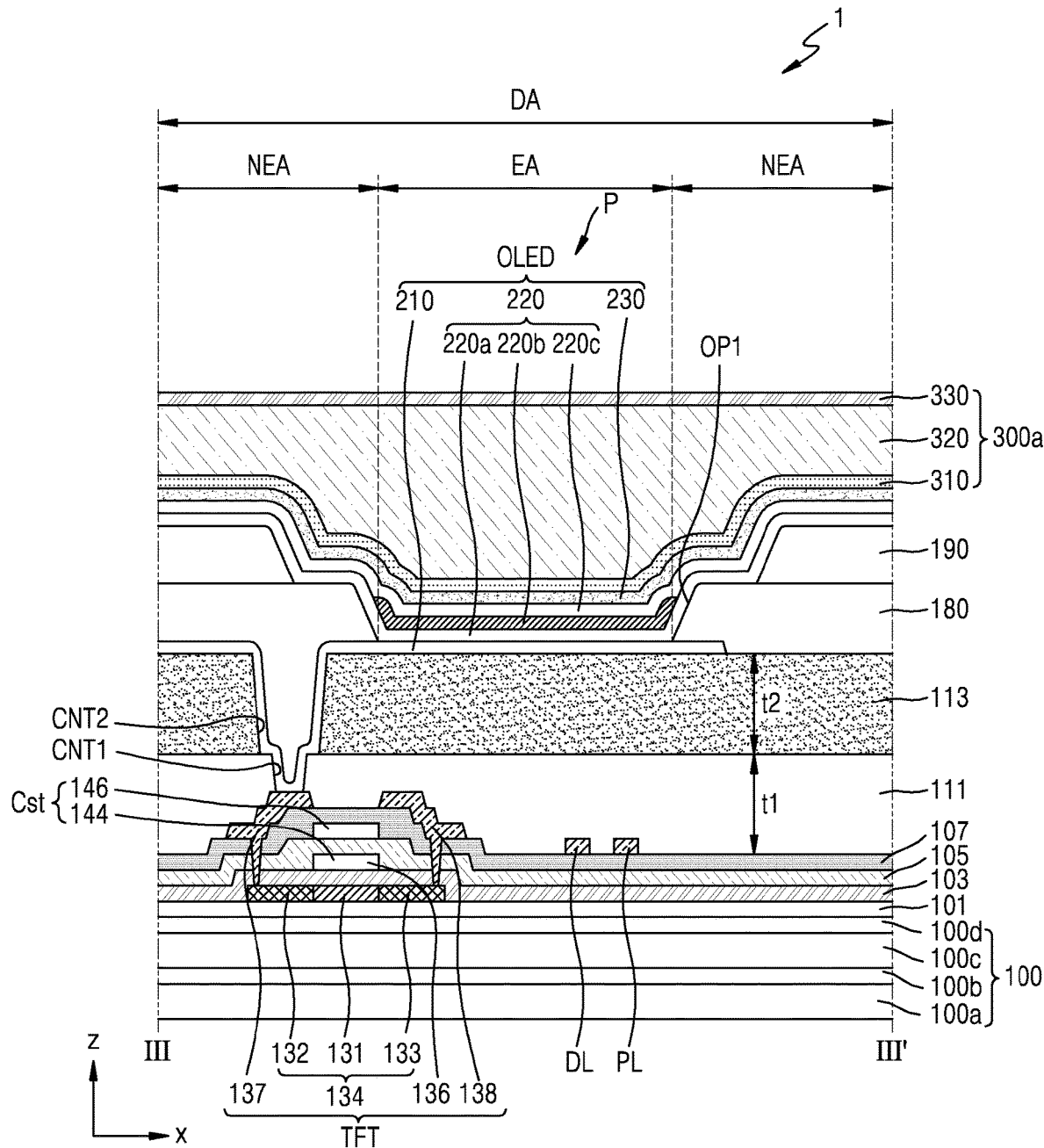
FIG. 13 and FIG. 14 are cross-sectional views of a display apparatus according to some embodiments.
Figure 14:
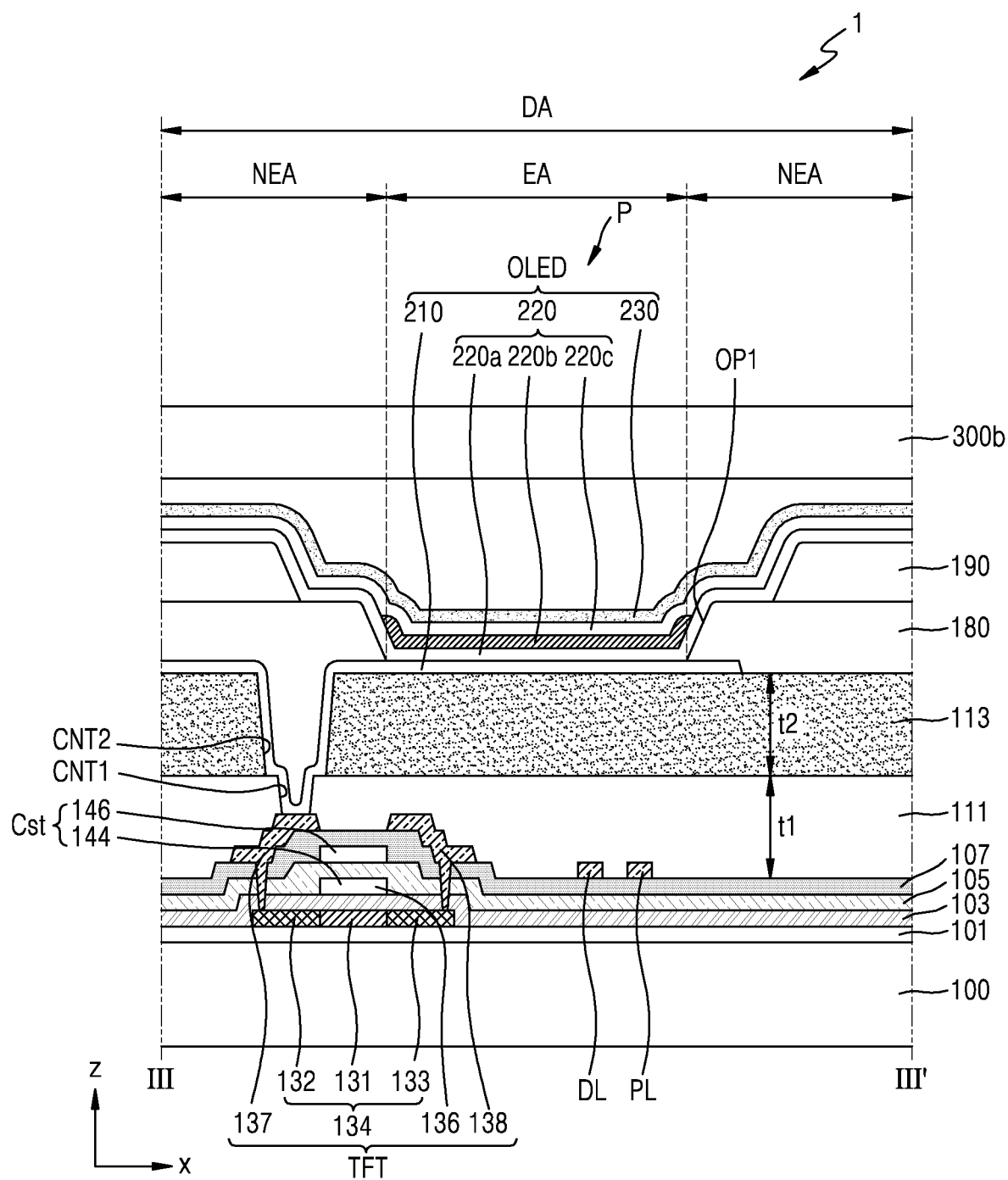

FIG. 13 and FIG. 14 are cross-sectional views of the display apparatus 1 according to some embodiments.

Referring to FIG. 13, the thin film transistor TFT and the organic light-emitting diode OLED are on the substrate 100, the thin film transistor TFT and the organic light-emitting diode OLED are electrically connected to each other, and a thin film encapsulation layer 300a may be on the organic light-emitting diode OLED. The thin film encapsulation layer 300a may be on the substrate 100, facing the substrate 100.

The substrate 100 may include a polymer resin. In an embodiment, the substrate 100 may include the first substrate 100a, the first barrier layer 100b on the first substrate 100a, the second substrate 100c on the first barrier layer 100b, and the second barrier layer 100d on the second substrate 100c. For example, the first substrate 100a and the second substrate 100c may include polyimide.

The thin film transistor TFT including the semiconductor layer 134, the gate electrode 136, and the source and drain electrodes 137 and 138 that are the connecting electrodes may be on the substrate 100. The organic light-emitting diode OLED including the pixel electrode 210, the intermediate layer 220, and the opposite electrode 230 may be on the thin film transistor TFT. The thin film transistor TFT and the organic light-emitting diode OLED may be electrically connected to each other via the first contact hole CNT1 defined in the first transparent planarization layer 111 and the second contact hole CNT2 defined in the colored planarization layer 113.

The organic light-emitting diode OLED may be covered by the thin film encapsulation layer 300a. In an embodiment, the thin film encapsulation layer 300a may include at least one inorganic encapsulation layer and at least one organic encapsulation layer. In an embodiment, the thin film encapsulation layer 300a may include a first inorganic encapsulation layer 310 and a second inorganic encapsulation layer 330, and an organic encapsulation layer 320 between the first and second inorganic encapsulation layers 310 and 330.

The first and second inorganic encapsulation layers 310 and 330 may each include one or more inorganic insulating materials. In an embodiment, the inorganic insulating material may include aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acryl-based resin, an epoxy-based resin, polyimide, polyethylene, etc. For example, the organic encapsulation layer 320 may include an acryl-based resin, e.g., polymethylmethacrylate, polyacrylic acid, etc.

Referring to FIG. 14, the thin film transistor TFT and the organic light-emitting diode OLED are on the substrate 100, the thin film transistor TFT and the organic light-emitting diode OLED are electrically connected to each other, and an encapsulation substrate 300b may be on the organic light-emitting diode OLED. The encapsulation substrate 300b may be on the substrate 100, facing the substrate 100.

In an embodiment, the substrate 100 may include a glass material. For example, the substrate 100 may include a glass material mainly including $SiO_2$.

The organic light-emitting diode OLED may be covered by the encapsulation substrate 300b. In an embodiment, the encapsulation substrate 300b may include a glass material. For example, the encapsulation substrate 300b may include a glass material mainly including $SiO_2$. The encapsulation substrate 300b faces the substrate 100, and the sealant ST (see FIG. 4) may be provided between the substrate 100 and the encapsulation substrate 300b. The sealant ST (see FIG. 4) is at an edge of the substrate 100, and may surround (e.g., entirely surround) the organic light-emitting diode OLED on the display area DA between the substrate 100 and the encapsulation substrate 300b.

FIGS. 15A to 15H are cross-sectional views of a display apparatus for describing processes in a method of manufacturing a display apparatus according to an embodiment.

Herein, a method of manufacturing the display apparatus will be described sequentially with reference to FIGS. 15A to 15H.

The method of manufacturing the display apparatus according to an embodiment may include forming the thin film transistor TFT on the substrate 100, forming the first transparent planarization layer 111 including the first contact hole CNT1 on the thin film transistor TFT, forming the colored planarization layer 113 including the second contact hole CNT2 and a colored pigment or carbon black on the first transparent planarization layer 111, and forming the pixel electrode 210 on the colored planarization layer 113, the pixel electrode 210 being electrically connected to the thin film transistor TFT via the first contact hole CNT1 and the second contact hole CNT2.

Figure 15A:
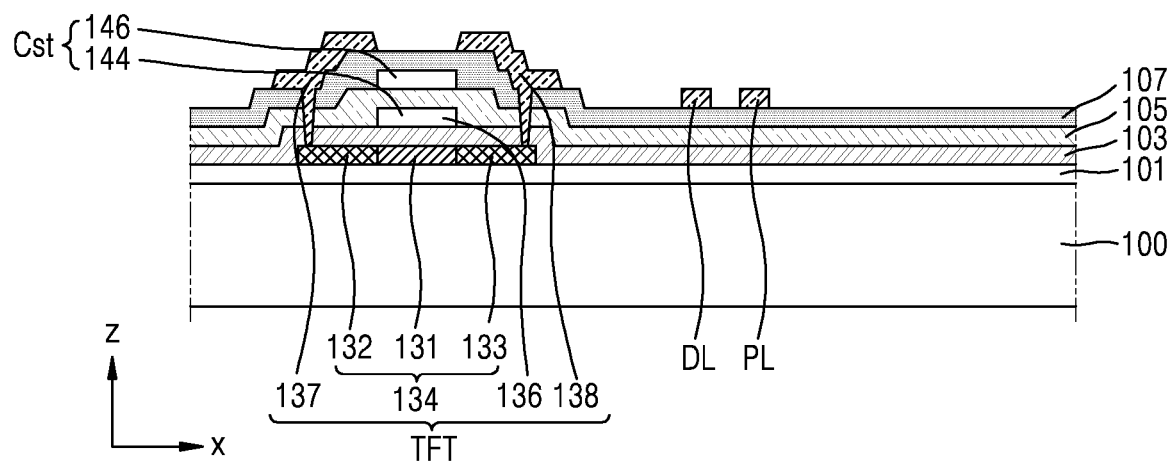
FIGS. 15A to 15H are cross-sectional views illustrating processes in a method of manufacturing a display apparatus according to an embodiment.

As shown in FIG. 15A, in the forming of the thin film transistor TFT on the substrate 100, the thin film transistor TFT including the semiconductor layer 134, the gate electrode 136, and the source and drain electrodes 137 and 138 that are the connecting electrodes may be formed on the substrate 100 including a glass material or a polymer resin.

The buffer layer 101 may be arranged on the substrate 100. The buffer layer 101 is on the substrate 100 to reduce or block infiltration of impurities, moisture, or external air from a lower portion of the substrate 100, and to provide a flat surface on the substrate 100. The buffer layer 101 may include an inorganic material such as an oxide material or a nitride material, an organic material, or an inorganic-organic composite material, and may have a single-layered or multi-layered structure including the inorganic material and the organic material.

The semiconductor layer 134 may be on the buffer layer 101. The semiconductor layer 134 is on the buffer layer 101, and may include a channel region 131 overlapping with the gate electrode 136, and a source region 132 and a drain region 133 at opposite sides of the channel region 131 and having impurities of higher concentration than that of the channel region 131. Here, the impurities may include N-type impurities or P-type impurities. The source region 132 and the drain region 133 may be electrically connected to the connecting electrode.

The first insulating layer 103 may be on the semiconductor layer 134, the gate electrode 136 may be on the first insulating layer 103, and the second insulating layer 105 may be on the gate electrode 136. In an embodiment, the first insulating layer 103 and the second insulating layer 105 may include the same material.

The storage capacitor Cst may be on the first insulating layer 103. The storage capacitor Cst may include a lower electrode 144 and an upper electrode 146 overlapping the lower electrode 144.

The third insulating layer 107 may be on the upper electrode 146, and the data line DL, the driving voltage line PL, and the source and drain electrodes 137 and 138 that are the connecting electrodes may be on the third insulating layer 107.

After forming the thin film transistor TFT on the substrate 100, a process of forming the first transparent planarization layer 111 including the first contact hole CNT1 on the thin film transistor TFT may be performed.

The forming of the first transparent planarization layer 111 including the first contact hole CNT1 on the thin film transistor TFT may include forming an insulating material layer 111M on the thin film transistor TFT, partially exposing the insulating material layer 111M, and developing the exposed insulating material layer 111M to form the first contact hole CNT1. Also, after the forming of the first contact hole CNT1 by developing the exposed insulating material layer 111M, a process of curing the first transparent planarization layer 111 may be further performed.

Figure 15B:
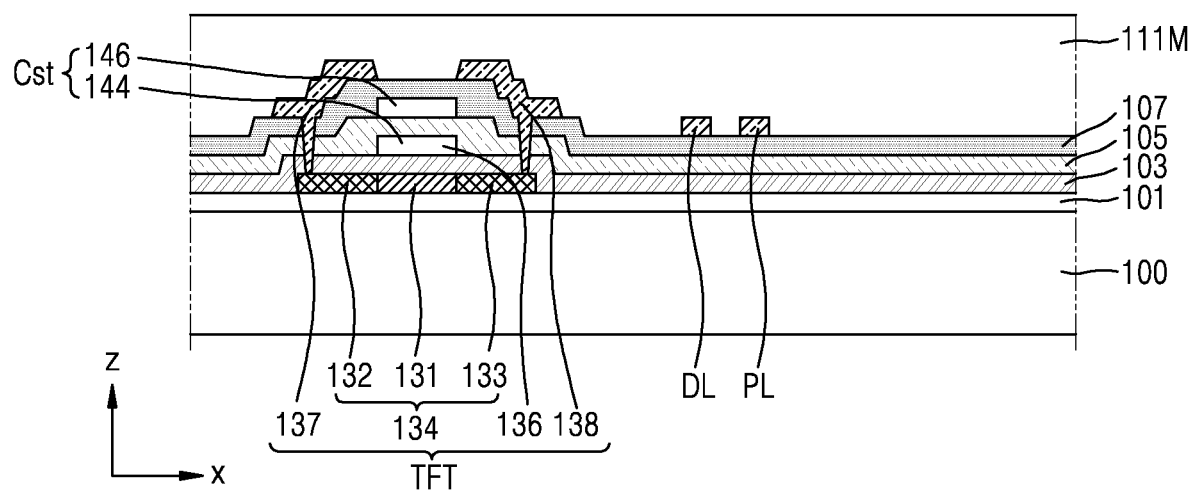

As shown in FIG. 15B, after the forming of the thin film transistor TFT on the substrate 100, the insulating material layer 111M may be on the thin film transistor TFT. The insulating material layer 111M may include a general universal polymer, such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The insulating material layer 111M may include a transparent material. For example, the insulating material layer 111M may include transparent polyimide. Also, the insulating material layer 111M may include a positive photosensitive material.

Figure 15C:
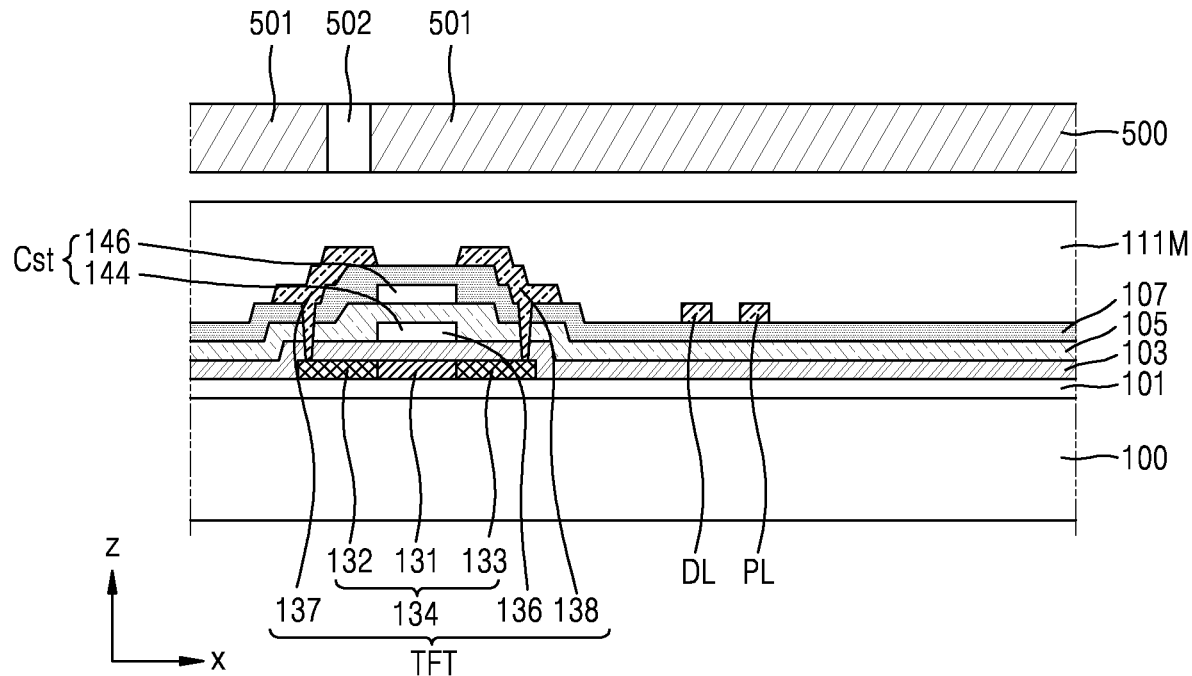

As shown in FIG. 15C, the insulating material layer 111M is coated on the thin film transistor TFT, and then a process of partially exposing the insulating material layer 111M by using a first mask 500 including a first light-blocking portion 501 and a first light-transmitting portion 502 may be performed.

A part of the insulating material layer 111M, the part overlapping the first light-transmitting portion 502 of the first mask 500, may be exposed, and the other part of the insulating material layer 111M, the other part overlapping the first light-blocking portion 501 of the first mask 500, may not be exposed.

Figure 15D:
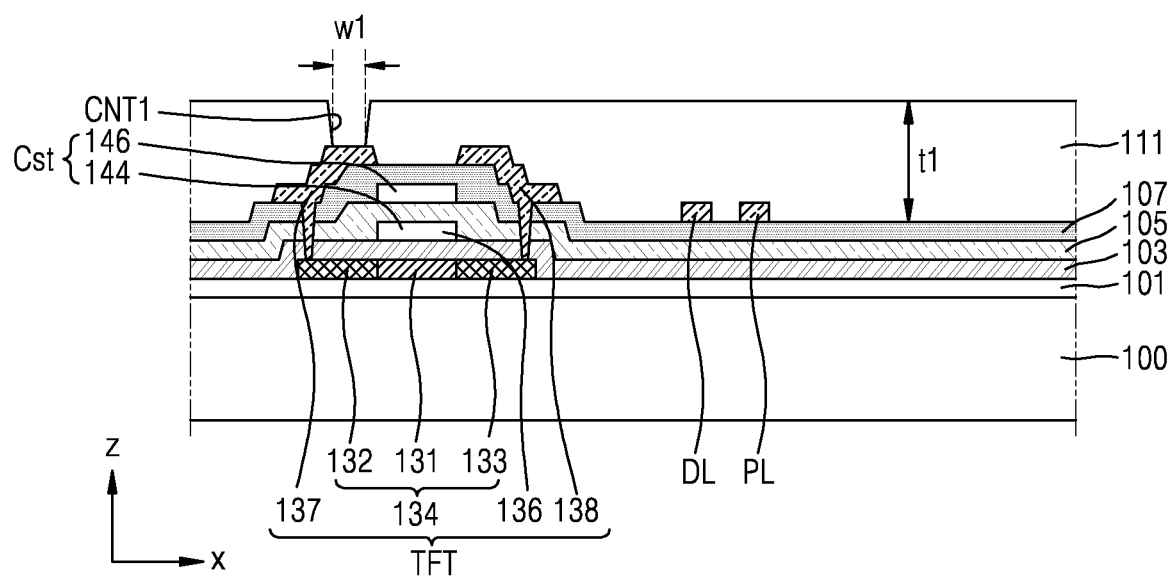

As shown in FIG. 15D, the insulating material layer 111M that is exposed may be developed. Through the development, the first transparent planarization layer 111 including the first contact hole CNT1 may be formed on the substrate 100. After the forming of the first transparent planarization layer 111 on the substrate 100 through the development, a curing process may be performed at a certain temperature.

The first transparent planarization layer 111 may be on the third insulating layer 107 to the first thickness t1 from an upper surface of the third insulating layer 107. In an embodiment, the first thickness t1 may be about 0.5 µm to about 2 µm, about 0.6 µm to about 1.8 µm, about 0.8 µm to about 1.5 µm, etc.

The first contact hole CNT1 defined in the first transparent planarization layer 111 may have the first width w1. In an embodiment, the first width w1 may be about 3 µm to about 5 µm, about 2.7 µm to about 5.3 µm, about 2.5 µm to about 5.5 µm, etc.

A process of forming the colored planarization layer 113 having the second contact hole CNT2 and including a colored pigment or carbon black that is different from the material of the first transparent planarization layer 111 on the first transparent planarization layer 111 may be performed.

The forming of the colored planarization layer 113 having the second contact hole CNT2 and including the colored pigment or carbon black that is different from the material of the first transparent planarization layer 111 on the first transparent planarization layer 111 may include forming a colored material layer 113M on the first transparent planarization layer 111, partially exposing the colored material layer 113M, and forming the second contact hole CNT2 by developing the colored material layer 113M that is exposed. Also, after the forming of the second contact hole CNT2 by developing the colored material layer 113M that is exposed, a process of curing the colored planarization layer 113 may be further performed.

Figure 15E:
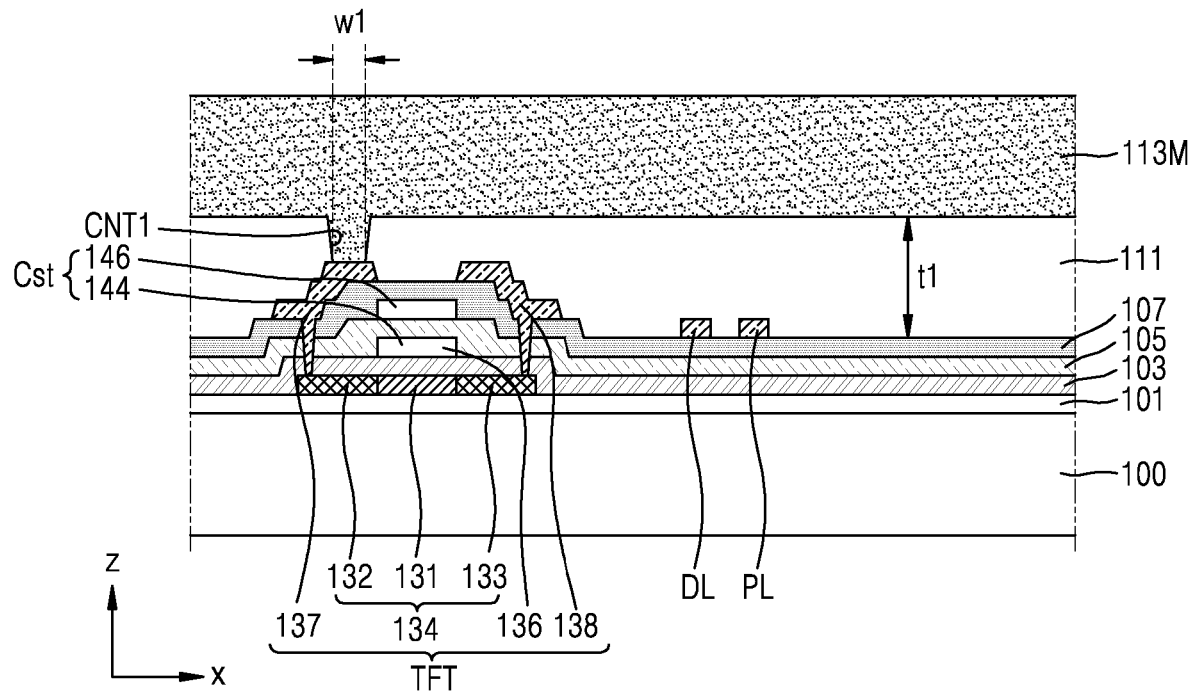

As shown in FIG. 15E, after the forming of the first transparent planarization layer 111, the forming of the colored material layer 113M on the first transparent planarization layer 111 may be performed. In an embodiment, the colored material layer 113M may be entirely coated on the substrate 100 so as to cover the first transparent planarization layer 111. The colored material layer 113M may have a photosensitive property different from that of the first transparent planarization layer 111. For example, the colored material layer 113M may include a negative photosensitive material.

Figure 15F:
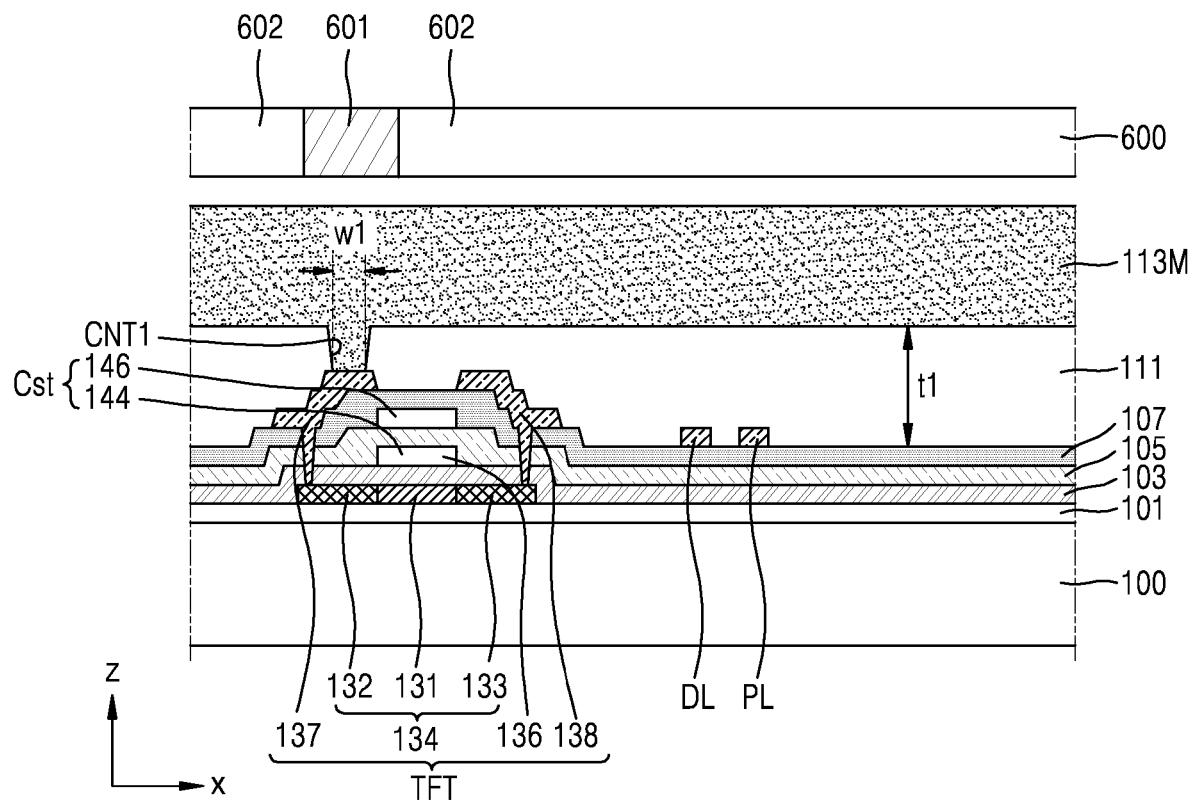

As shown in FIG. 15F, after the coating of the colored material layer 113M on the first transparent planarization layer 111, a process of partially exposing the colored material layer 113M by using a second mask 600 including a second light-blocking portion 601 and a second light-transmitting portion 602 may be performed.

A part of the colored material layer 113M, the part overlapping the second light-transmitting portion 602 of the second mask 600, may be exposed, and the other part of the colored material layer 113M, the other part overlapping the second light-blocking portion 601 of the second mask 600, may not be exposed.

Figure 15G:
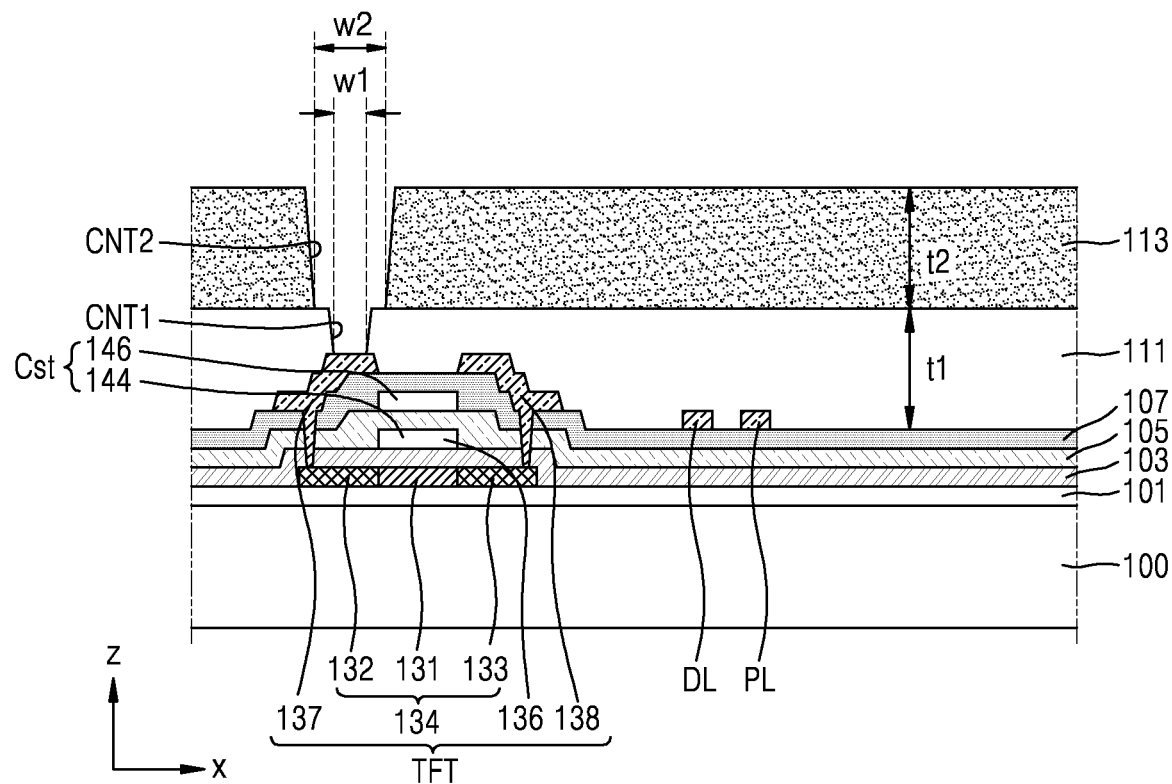

As shown in FIG. 15G, the colored material layer 113M that is exposed may be developed. For example, during the developing of the colored material layer 113M, the exposed part of the colored material layer 113M remains and the non-exposed part of the colored material layer 113M may be removed through the developing process. As such, the colored planarization layer 113 including the second contact hole CNT2 may be formed on the substrate 100. After the forming of the colored planarization layer 113 on the substrate 100, a curing process may be performed at a certain temperature.

The colored planarization layer 113 may include a colored material. For example, the colored planarization layer 113 may include a colored pigment, e.g., a pigment of a certain color, such as white or black. In an embodiment, the colored planarization layer 113 may be black. For example, the colored planarization layer 113 may include a polyimide (PI)-based binder, and a pigment in which red, green, and blue colors are mixed. In another embodiment, the colored planarization layer 113 may include a cardo-based binder resin and a mixture of a lactam black pigment and a blue pigment. In another embodiment, the colored planarization layer 113 may include carbon black.

Because the colored planarization layer 113 is obtained from the colored material layer 113M, the colored planarization layer 113 may have a negative photosensitive property and may prevent or substantially prevent external light from being reflected due to a colored pigment. The colored planarization layer 113 including the colored pigment may prevent or substantially prevent reflection of the external light proceeding from the outside towards the display apparatus, may improve contrast of the display apparatus, and may prevent or substantially prevent oxidation of the opposite electrode 230 due to gases that are generated due to photolysis of materials in the first transparent planarization layer 111 generated by the external light.

In an embodiment, the colored planarization layer 113 may be directly on the first transparent planarization layer 111. The colored planarization layer 113 may be on the first transparent planarization layer 111 to the second thickness t2 from the upper surface of the first transparent planarization layer 111. In an embodiment, the second thickness t2 may be about 0.5 µm to about 2 µm, about 0.6 µm to about 1.8 µm, about 0.8 µm to about 1.5 µm, etc.

In an embodiment, the first thickness t1 of the first transparent planarization layer 111 and the second thickness t2 of the colored planarization layer 113 may be equal to each other. In another embodiment, the first thickness t1 of the first transparent planarization layer 111 may be different from the second thickness t2 of the colored planarization layer 113.

The second contact hole CNT2 defined in the colored planarization layer 113 may have a second width w2 that is different from the first width w1 of the first contact hole CNT1 defined in the first transparent planarization layer 111. In an embodiment, the second width w2 may be about 5 µm to about 7 µm, about 6 µm to about 10 µm, about 4.5 µm to about 7.5 µm, etc. For example, the second contact hole CNT2 defined in the colored planarization layer 113 may have the second width w2 that is greater than the first width w1 of the first contact hole CNT1 defined in the first transparent planarization layer 111. In an embodiment, when the second contact hole CNT2 defined in the colored planarization layer 113 has a greater width than that of the first contact hole CNT1 defined in the first transparent planarization layer 111, the pixel electrode 210 may be stably connected to the source electrode 137 or the drain electrode 138, that is, the connecting electrode.

In an embodiment, the first contact hole CNT1 in the first transparent planarization layer 111 and the second contact hole CNT2 in the colored planarization layer 113 may overlap with each other in a direction perpendicular to the substrate 100, that is, a z-direction. In an embodiment, the first contact hole CNT1 in the first transparent planarization layer 111 and the second contact hole CNT2 in the colored planarization layer 113 may completely overlap each other in the z-direction. For example, a minimum width of the second contact hole CNT2 in the colored planarization layer 113 may be greater than a maximum width of the first contact hole CNT1 in the first transparent planarization layer 111, and the second contact hole CNT2 of the colored planarization layer 113 may surround the first contact hole CNT1 in the first transparent planarization layer 111 in a plan view.

Figure 15H:
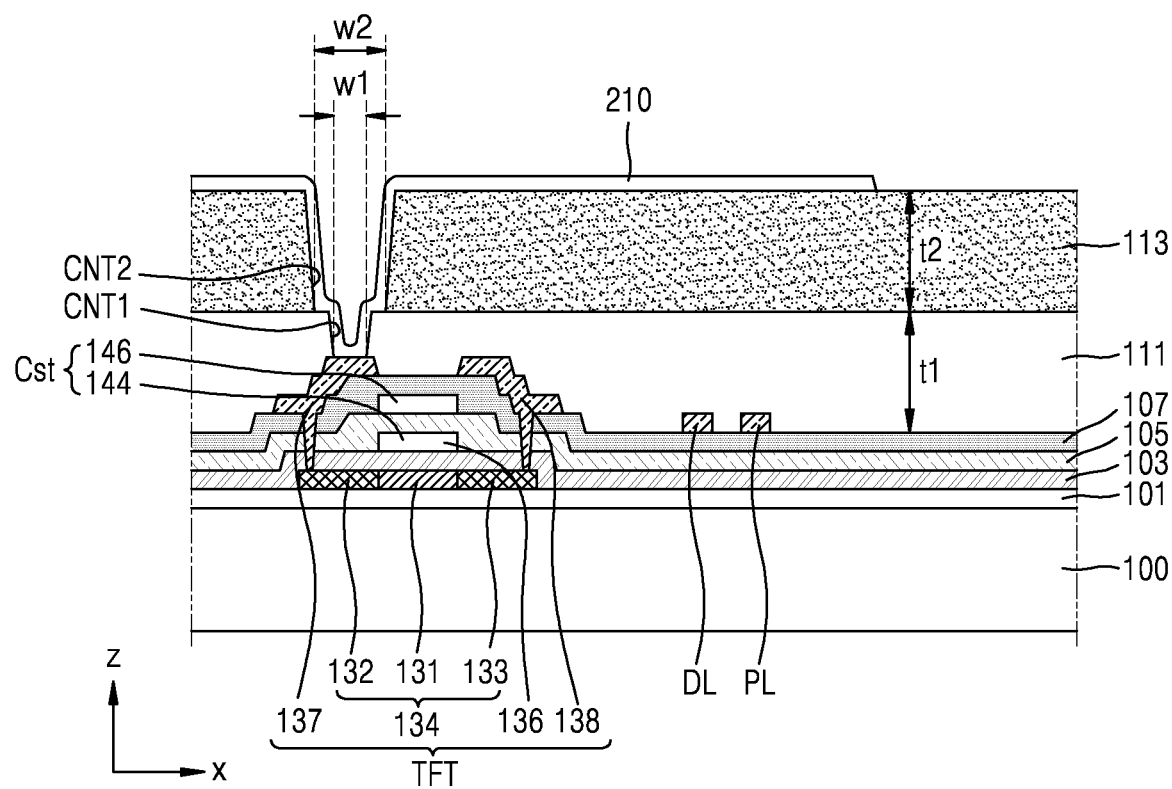

As shown in FIG. 15H, after the forming of the colored planarization layer 113 on the first transparent planarization layer 111, a process of forming the pixel electrode 210 that is electrically connected to the thin film transistor TFT via the first contact hole CNT1 and the second contact hole CNT2 on the colored planarization layer 113 may be performed.

The pixel electrode 210 may be formed on the colored planarization layer 113. The pixel electrode 210 may include a (semi-) transmissive electrode or a reflective electrode. In an embodiment, the pixel electrode 210 may include a reflective layer including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and a compound thereof, and a transparent or semi-transparent electrode layer on the reflective layer. In an embodiment, the transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). In an embodiment, the pixel electrode 210 may include a stack structure including ITO/Ag/ITO.

The pixel electrode 210 may be electrically connected to the source electrode 137 or the drain electrode 138 via the first contact hole CNT1 defined in the first transparent planarization layer 111 and the second contact hole CNT2 defined in the colored planarization layer 113. That is, the organic light-emitting diode OLED may be electrically connected to the thin film transistor TFT via the first contact hole CNT1 defined in the first transparent planarization layer 111 and the second contact hole CNT2 defined in the colored planarization layer 113.

In a display apparatus of the related art, the opposite electrode may be oxidized by the gases that are discharged when the organic material in the planarization layer is decomposed due to the external light. Also, when the pixel defining layer including the colored pigment or the carbon black is arranged on the pixel electrode in order to prevent or reduce the photolysis of the organic material in the planarization layer due to the external light, the colored pigment may react with the pixel electrode and dark spots may be generated.

However, according to one or more embodiments of the present disclosure, the colored planarization layer including the colored pigment or carbon black that is different from the material of the transparent planarization layer is on the transparent planarization layer including the organic material, and, thus, oxidation of the opposite electrode due to the photolysis of the organic material in the transparent planarization layer by the external light may be prevented or substantially prevented, and generation of dark spots when the colored pigment reacts with the pixel electrode may be prevented or substantially prevented. Thus, the contrast of the display apparatus may be improved, and the display apparatus may have improved reliability.

One or more embodiments of the present disclosure may provide the display apparatus, in which generation of dark spots may be prevented or substantially prevented and degradation of the contrast may be prevented or substantially prevented. However, the above technical features are provided as examples, and the scope of the present disclosure is not limited thereto.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
   a substrate;
   a thin film transistor on an upper surface of the substrate, the thin film transistor comprising at least one of a source electrode or a drain electrode;
   a pixel electrode electrically connected to the thin film transistor;
   a first transparent planarization layer between the pixel electrode and an upper surface of the at least one of the source electrode or the drain electrode and comprising an organic material comprising at least one selected from the group consisting of benzocyclobutene, hexamethyldisiloxane, polymethylmethacrylate, polystyrene, and polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof, the first transparent planarization layer comprising a first contact hole for electrically connecting the thin film transistor to the pixel electrode;
   a second transparent planarization layer between the substrate and the first transparent planarization layer, wherein the second transparent planarization layer covers at least one of the source electrode or the drain electrode;
   a contact metal layer between the second transparent planarization layer and the first transparent planarization layer, wherein the contact metal layer is electrically connected to the pixel electrode and at least one of the source electrode or the drain electrode; and
   a colored planarization layer on the first transparent planarization layer and comprising a colored pigment or carbon black, the colored planarization layer comprising a second contact hole for electrically connecting the thin film transistor to the pixel electrode,
   wherein the first contact hole has a first width, and the second contact hole has a second width that is greater than the first width, and the pixel electrode extends through the second contact hole from an upper surface of the colored planarization layer to directly contact and extend along an upper surface of the first transparent planarization layer that extends parallel to the upper surface of the substrate, and
   wherein the first width is about 3 μm to about 5 μm and the second width is about 5 μm to about 7 μm.

2. The display apparatus of claim 1, wherein the colored planarization layer is directly on the first transparent planarization layer, the first transparent planarization layer comprises a positive photosensitive material, and the colored planarization layer comprises a negative photosensitive material.

3. The display apparatus of claim 1, wherein the thin film transistor comprises a semiconductor layer, a gate electrode, and a connecting electrode, the connecting electrode comprising the at least one of the source electrode or the drain electrode, the gate electrode being on the semiconductor layer and the connecting electrode being on the gate electrode, and
   the semiconductor layer and the gate electrode are insulated from each other by a first insulating layer, and the gate electrode and the connecting electrode are insulated from each other by a second insulating layer and a third insulating layer.

4. The display apparatus of claim 3, wherein the first transparent planarization layer has a first thickness from an upper surface of the third insulating layer, and the first thickness is about 0.5 μm to about 2 μm.

5. The display apparatus of claim 4, wherein the colored planarization layer has a second thickness from the upper surface of the first transparent planarization layer, and the second thickness is about 0.5 μm to about 2 μm.

6. The display apparatus of claim 1, wherein the second transparent planarization layer has a third thickness from an upper surface of the third insulating layer, and the third thickness is about 0.5 μm to about 2 μm.

7. The display apparatus of claim 1, wherein the first contact hole in the first transparent planarization layer and the second contact hole in the colored planarization layer overlap with each other.

8. The display apparatus of claim 1, further comprising:
   a pixel defining layer comprising a first opening that at least partially exposes the pixel electrode;
   an intermediate layer comprising an emission layer and at least one functional layer, the emission layer overlapping the first opening; and
   an opposite electrode on the intermediate layer.

9. The display apparatus of claim 8, further comprising a spacer on the pixel defining layer,
   wherein the spacer comprises a material that is the same as a material included in the pixel defining layer.

10. A method of manufacturing a display apparatus, the method comprising:
    forming a thin film transistor on an upper surface of a substrate, the thin film transistor comprising at least one of a source electrode or a drain electrode;
    forming a first transparent planarization layer on the thin film transistor, the first transparent planarization layer comprising a first contact hole and comprising an organic material comprising at least one selected from the group consisting of benzocyclobutene, hexamethyldisiloxane, polymethylmethacrylate, polystyrene, and polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof;
    forming a colored planarization layer on the first transparent planarization layer, the colored planarization layer comprising a second contact hole and comprising a colored pigment or carbon black; and
    forming a pixel electrode on the colored planarization layer, the pixel electrode being electrically connected to the thin film transistor via the first contact hole and the second contact hole, the first transparent planarization layer being between the pixel electrode and an upper surface of the at least one of the source electrode or the drain electrode,
    wherein the first contact hole has a first width, and the second contact hole has a second width that is greater than the first width, and the pixel electrode extends through the second contact hole from an upper surface of the colored planarization layer to directly contact and extend along an upper surface of the first transparent planarization layer that extends parallel to the upper surface of the substrate, and
    wherein the first width is about 3 μm to about 5 μm and the second width is about 5 μm to about 7 μm, and wherein the display apparatus comprises:
- a second transparent planarization layer between the substrate and the first transparent planarization layer, wherein the second transparent planarization layer covers at least one of the source electrode or the drain electrode; and
- a contact metal layer between the second transparent planarization layer and the first transparent planarization layer, wherein the contact metal layer is electrically connected to the pixel electrode and at least one of the source electrode or the drain electrode.

11. The method of claim 10, wherein the forming of the colored planarization layer comprises:
- forming a colored material layer on the first transparent planarization layer;
- partially exposing the colored material layer; and
- forming the second contact hole by developing the colored material layer that is exposed.

12. The method of claim 11, further comprising, after the forming of the second contact hole, curing the colored planarization layer.

13. The method of claim 11, wherein the colored planarization layer is directly on the first transparent planarization layer, the first transparent planarization layer comprises a positive photosensitive material, and the colored planarization layer comprises a negative photosensitive material.

14. The method of claim 11, wherein the thin film transistor comprises a semiconductor layer, a gate electrode, and a connecting electrode, the connecting electrode comprising the at least one of the source electrode or the drain electrode, the gate electrode being on the semiconductor layer, and the connecting electrode being on the gate electrode, and
- the semiconductor layer and the gate electrode are insulated from each other by a first insulating layer, and the gate electrode and the connecting electrode are insulated from each other by a second insulating layer and a third insulating layer.

15. The method of claim 14, wherein the first transparent planarization layer has a first thickness from an upper surface of the third insulating layer, and the colored planarization layer has a second thickness from the upper surface of the first transparent planarization layer.

16. The method of claim 10, wherein the first contact hole in the first transparent planarization layer and the second contact hole in the colored planarization layer overlap with each other.

* * * * *